(12) United States Patent
MacKay et al.

(10) Patent No.: US 7,654,432 B2
(45) Date of Patent: *Feb. 2, 2010

(54) FORMING SOLDER BALLS ON SUBSTRATES

(75) Inventors: John MacKay, Sunnyvale, CA (US);
Tom Molinaro, Pleasant Hill, CA (US)

(73) Assignee: WSTP, LLC, San Clemente, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/323,772

(22) Filed: Nov. 26, 2008

(65) Prior Publication Data

US 2009/0159641 A1 Jun. 25, 2009

Related U.S. Application Data

(60) Division of application No. 11/370,500, filed on Mar. 7, 2006, which is a continuation of application No. 10/643,766, filed on Aug. 18, 2003, now Pat. No. 7,007,833, which is a continuation-in-part of application No. 10/630,310, filed on Jul. 30, 2003, now abandoned, which is a continuation-in-part of application No. 09/962,007, filed on Sep. 24, 2001, now Pat. No. 6,609,652, which is a continuation-in-part of application No. 09/273,517, filed on Mar. 22, 1999, now Pat. No. 6,293,456, which is a continuation-in-part of application No. 08/863,800, filed on May 27, 1997, now Pat. No. 5,988,487.

(51) Int. Cl.
*B23K 37/04* (2006.01)

(52) U.S. Cl. .................. 228/39; 228/41; 228/44.7; 228/49.5; 269/21

(58) Field of Classification Search .................. 228/246; 156/285
See application file for complete search history.

(56) References Cited

U.S. PATENT DOCUMENTS

| | | | | |
|---|---|---|---|---|
| 3,458,925 | A | 8/1969 | Napier et al. | 29/578 |
| 3,520,055 | A | 7/1970 | Jannett | 29/830 |
| 3,569,607 | A | 3/1971 | Martyak et al. | 174/68.5 |
| 3,617,045 | A | 11/1971 | DaCosta et al | 269/21 |
| 3,719,981 | A | 3/1973 | Steitz | 29/423 |
| 4,412,642 | A | 11/1983 | Fisher, Jr. | 228/173 |
| 4,523,712 | A | 6/1985 | Zado | 228/207 |
| 4,545,610 | A | 10/1985 | Lakritz et al. | 29/589 |

(Continued)

OTHER PUBLICATIONS

1995 Ball Grid Array Technology, Lau. McGraw-Hill, 1995 ISBN: 007036608X.

*Primary Examiner*—Kiley Stoner
(74) *Attorney, Agent, or Firm*—Fish & Associates, PC

(57) ABSTRACT

A mask (stencil) having cells (openings) is disposed on a surface of a heater stage, and is then filled (printed) with solder paste. Then a substrate is assembled to the opposite side of the mask. Then the solder paste is reflowed. This may be done partially inverted. Then the mask is separated from the substrate, either before or after cooling. Solder balls are thus formed on the substrate, which may be a semiconductor wafer. A biased chuck urges the substrate into intimate contact with the mask. A method for printing the mask with solder paste is described. Methods of forming high aspect ratio solder bumps (including balls and reflowable interconnect structures) are described.

11 Claims, 16 Drawing Sheets

U.S. PATENT DOCUMENTS

| | | | |
|---|---|---|---|
| 4,622,239 A | 11/1986 | Schoenthaler et al. | 427/96 |
| 4,655,164 A | 4/1987 | Nelson et al. | 118/503 |
| 4,763,829 A | 8/1988 | Sherry | 228/124 |
| 4,856,185 A | 8/1989 | Baumgartner | 29/840 |
| 4,893,403 A | 1/1990 | Heflinger et al. | 29/840 |
| 4,898,320 A | 2/1990 | Dunaway et al. | 228/245 |
| 4,906,823 A | 3/1990 | Kushima et al. | 228/245 |
| 4,914,814 A | 4/1990 | Behun et al. | 29/843 |
| 4,950,623 A | 8/1990 | Dishon | 437/183 |
| 4,953,460 A | 9/1990 | Wojcik | 101/129 |
| 5,001,829 A | 3/1991 | Shelhorn | 29/840 |
| 5,014,162 A | 5/1991 | Clark et al. | 361/412 |
| 5,024,372 A | 6/1991 | Altman et al. | 228/248 |
| 5,039,628 A | 8/1991 | Carey | 437/183 |
| 5,046,161 A | 9/1991 | Takada | 357/69 |
| 5,079,835 A | 1/1992 | Lam | 29/840 |
| 5,108,027 A | 4/1992 | Warner et al. | 228/254 |
| 5,118,027 A | 6/1992 | Braun et al. | 228/180.2 |
| 5,118,029 A | 6/1992 | Fuse et al. | 228/198 |
| 5,137,845 A | 8/1992 | Lochon et al. | 437/183 |
| 5,141,212 A | 8/1992 | Beeding | 269/21 |
| 5,172,469 A | 12/1992 | Onda et al. | 29/762 |
| 5,197,655 A | 3/1993 | Leerssen et al. | 228/254 |
| 5,206,585 A | 4/1993 | Chang et al. | 324/158 P |
| 5,211,328 A | 5/1993 | Ameen et al. | 228/180 |
| 5,268,068 A | 12/1993 | Cowell et al. | 156/644 |
| 5,307,983 A | 5/1994 | Dudderar et al. | 228/180.22 |
| 5,310,574 A | 5/1994 | Holtmann | 427/58 |
| 5,346,118 A | 9/1994 | Degani et al. | 228/180.22 |
| 5,366,760 A | 11/1994 | Fujii et al. | 427/96 |
| 5,372,295 A | 12/1994 | Abe et al. | 228/123.1 |
| 5,381,848 A | 1/1995 | Trabucco | 164/102 |
| 5,388,327 A | 2/1995 | Trabucco | 29/830 |
| 5,395,040 A | 3/1995 | Holzmann | 228/254 |
| 5,438,020 A | 8/1995 | Grancher et al. | 437/183 |
| 5,439,164 A | 8/1995 | Hasegawa et al. | 228/194 |
| 5,449,108 A | 9/1995 | Park | 228/103 |
| 5,460,316 A | 10/1995 | Hefele | 228/39 |
| 5,480,835 A | 1/1996 | Carney et al. | 437/189 |
| 5,492,266 A | 2/1996 | Hoebner et al. | 228/248.1 |
| 5,535,936 A | 7/1996 | Chong et al. | 228/175 |
| 5,536,677 A | 7/1996 | Hubacher | 437/183 |
| 5,539,153 A | 7/1996 | Schwiebert et al. | 174/260 |
| 5,632,434 A | 5/1997 | Evans et al. | 229/44.7 |
| 5,658,827 A | 8/1997 | Aulicino et al. | 228/180.22 |
| 5,667,128 A | 9/1997 | Rohde et al. | 228/49.5 |
| 5,759,269 A | 6/1998 | Cutting et al. | 118/213 |
| 5,773,897 A | 6/1998 | Wen et al. | 257/778 |
| 5,782,399 A | 7/1998 | Lapastora | 228/41 |
| 5,804,017 A * | 9/1998 | Hector | 156/242 |
| 5,806,753 A | 9/1998 | Bielick et al. | 228/248.1 |
| 5,829,668 A | 11/1998 | George et al. | 228/254 |
| 5,842,626 A | 12/1998 | Bhansali et al. | 228/180.22 |
| 5,877,079 A | 3/1999 | Karasawa et al. | 438/613 |
| 5,934,545 A | 8/1999 | Gordon | 228/191 |
| 5,950,908 A | 9/1999 | Fujino et al. | 228/248.1 |
| 5,988,487 A | 11/1999 | Mackay et al. | 228/254 |
| 6,008,071 A | 12/1999 | Karasawa et al. | 438/115 |
| 6,051,273 A | 4/2000 | Dalal et al. | 427/124 |
| 6,109,175 A | 8/2000 | Kinoshita | 101/170 |
| 6,126,059 A | 10/2000 | Mackay et al. | 228/9 |
| 6,153,505 A | 11/2000 | Bolde et al. | 438/613 |
| 6,271,503 B1 | 8/2001 | Hall et al. | 219/444.1 |
| 6,293,456 B1 | 9/2001 | Mackay et al. | |
| 7,007,833 B2 | 3/2006 | Mackay et al. | 228/44.7 |
| 2005/0150936 A1 | 7/2005 | Mackay et al. | 228/254 |
| 2006/0035454 A1 | 2/2006 | Belanger et al. | |

\* cited by examiner

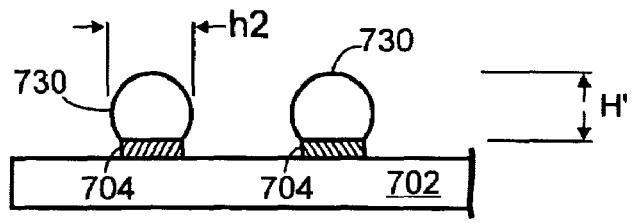
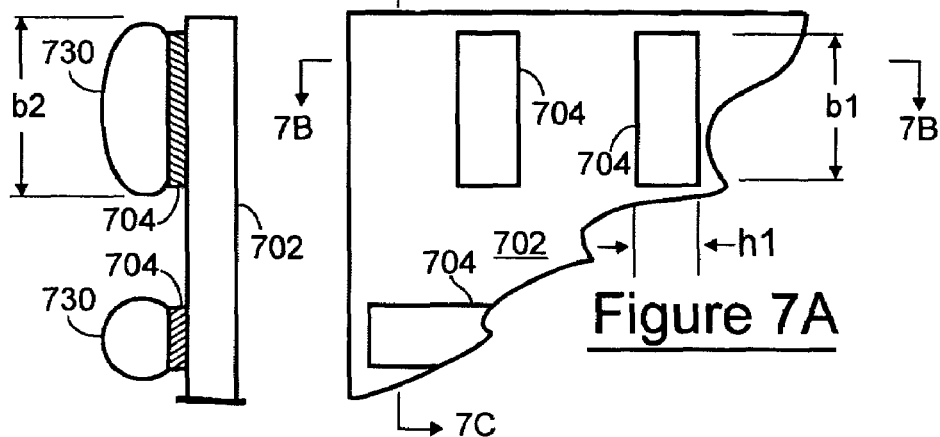
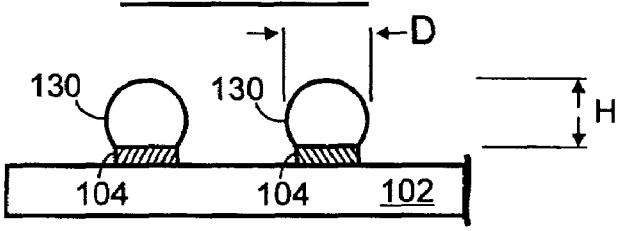
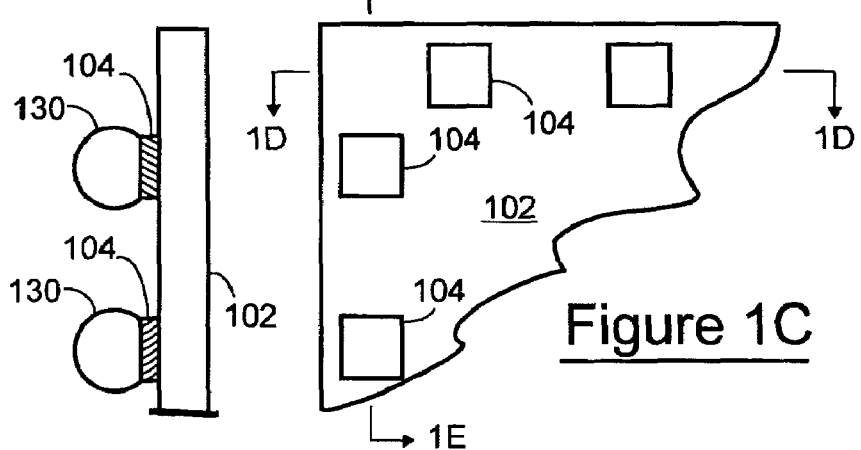

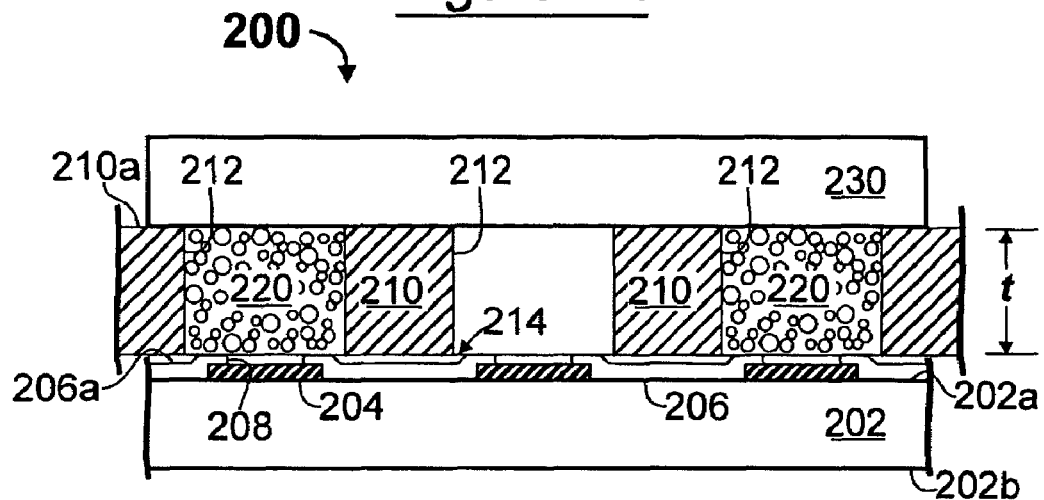
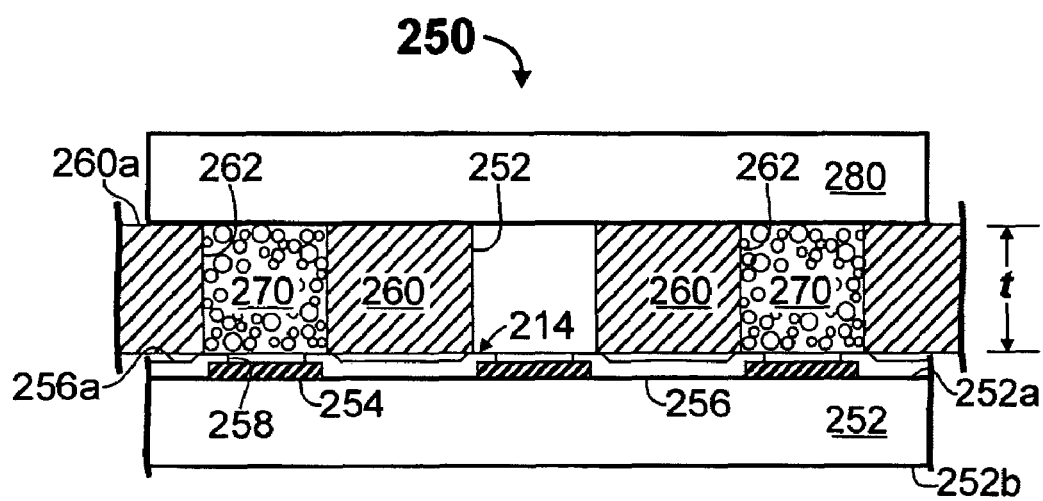

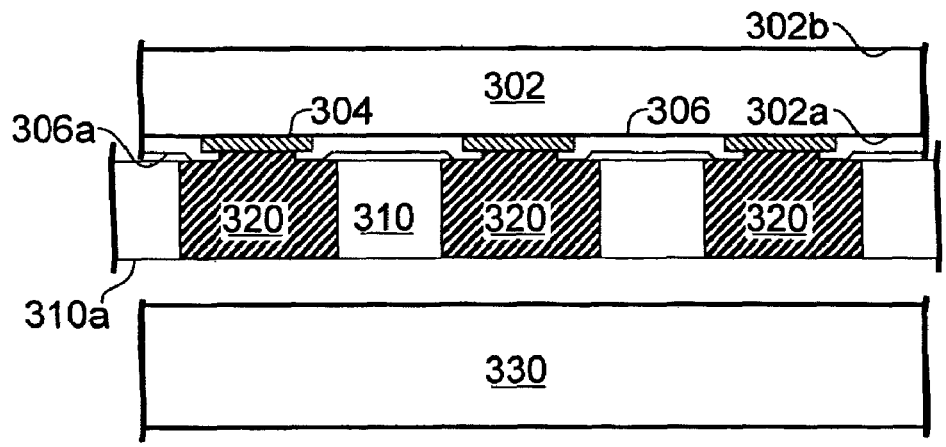
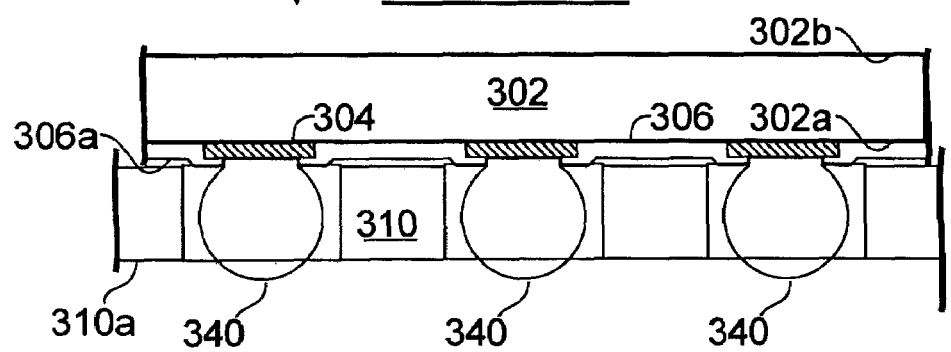
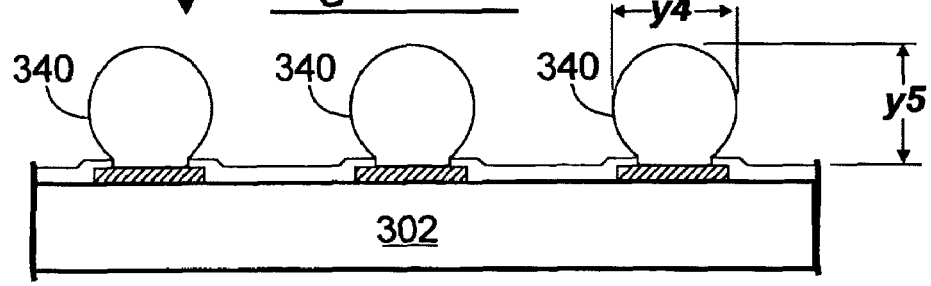

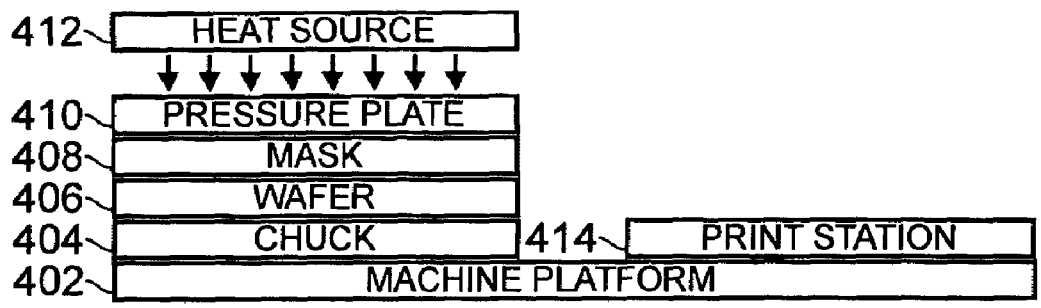
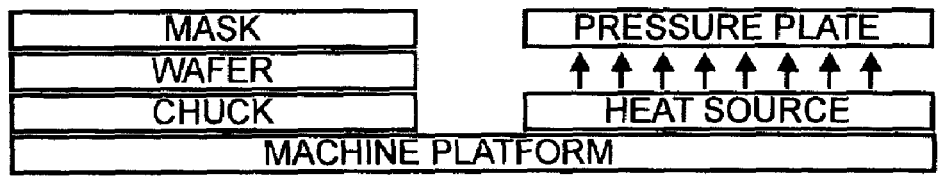
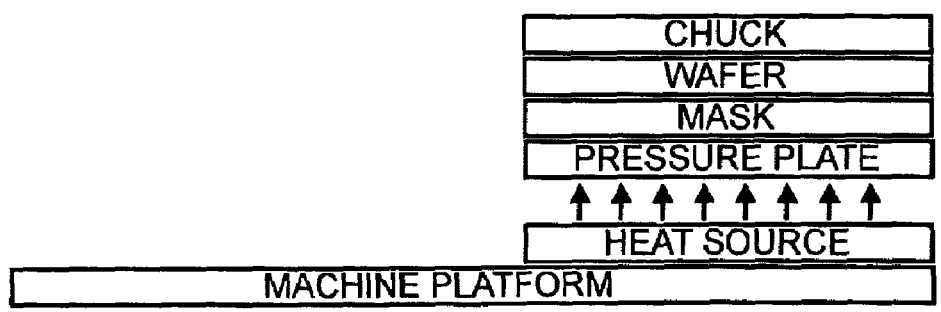

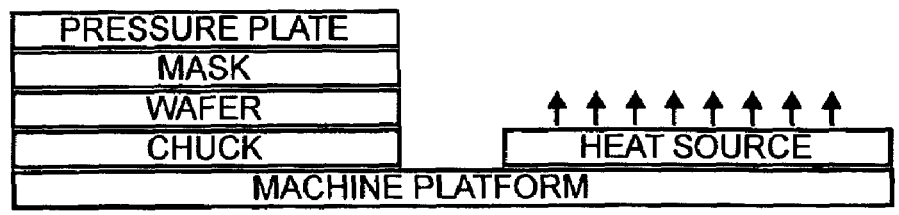
Figure 4C
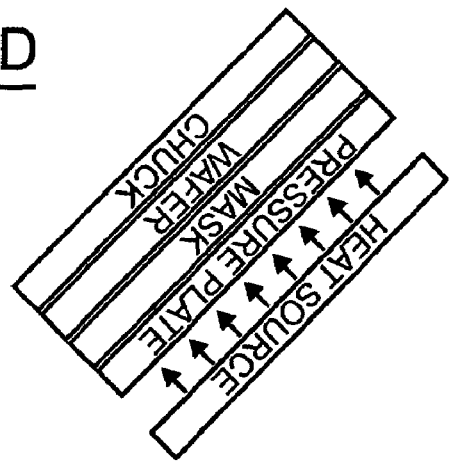
Figure 4D
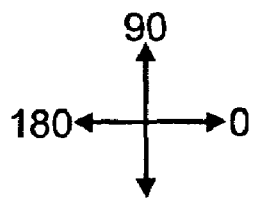
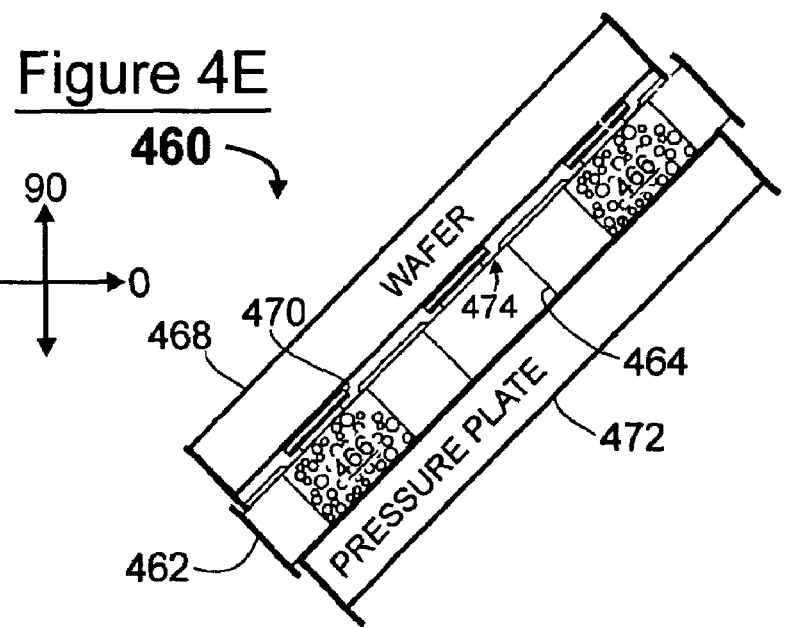
Figure 4E
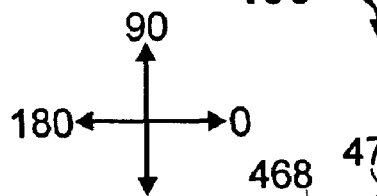

Step 1
bump

Step 2
encapsulate
(overmold)

Step 3
lap

Step 4
bump, again

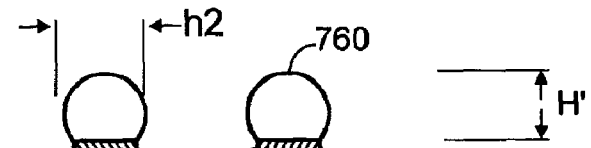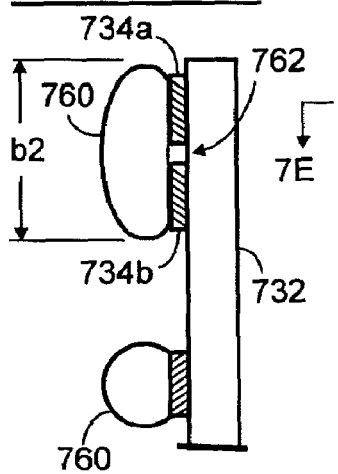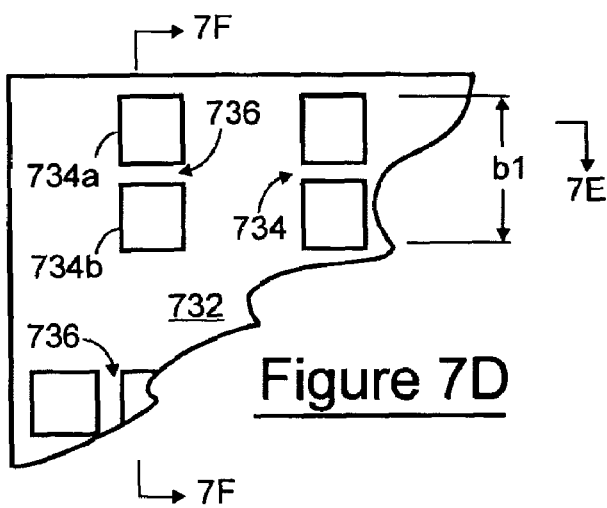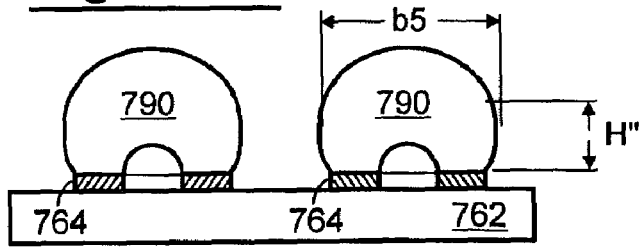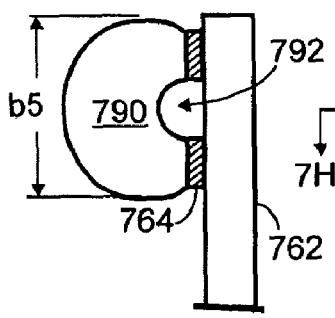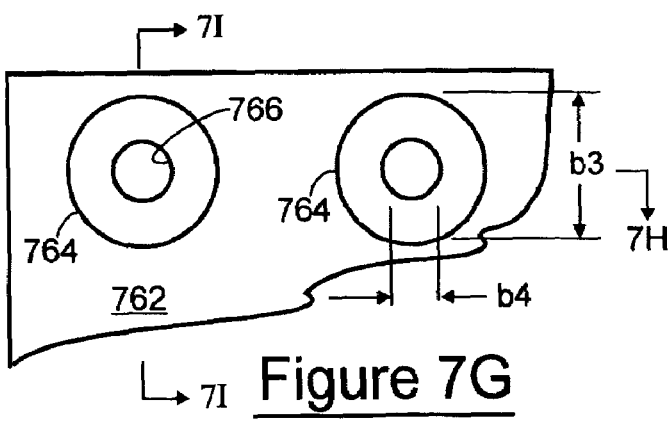

FORMING SOLDER BALLS ON SUBSTRATES

CROSS-REFERENCES TO RELATED APPLICATIONS

This application is a divisional of U.S. Ser. No. 11/370,500 filed on Mar. 7, 2006, which is a Continuation of application Ser. No. 10/643,766, filed on Aug. 18, 2003, now U.S. Pat. No. 7,007,833, which is a continuation-in-part of application Ser. No. 09/962,007, filed on Sep. 24, 2001, now U.S. Pat. No. 6,609,652, which is a continuation-in-part of application Ser. No. 09/273,517, filed on Mar. 22, 1999, now U.S. Pat. No. 6,293,456, which is a continuation-in-part of application Ser. No. 08/863,800, filed on May 27, 1997, now U.S. Pat. No. 5,988,487. Said application Ser. No. 10/643,766 is a continuation-in part of application Ser. No. 10/630,310, filed on Jul. 30, 2003, now abandoned, which is a continuation-in-part of application Ser. No. 09/962,007, filed on Sep. 24, 2001, now U.S. Pat. No. 6,609,652.

TECHNICAL FIELD OF THE INVENTION

The invention relates to methods of forming solder balls on substrates which are electronic components such as semiconductor devices (integrated circuit chips) and interconnection substrates, and to apparatuses for forming the solder balls on the electronic components.

BACKGROUND OF THE INVENTION

In recent years, flip-chip bonding techniques have increasingly been used to connect (bond) integrated circuit (IC) chips to interconnection substrates and to package substrates. In flip-chip bonding an IC chip component to an interconnection component such as ceramic interconnection substrate, a plurality (e.g., an array) of solder balls (also called "solder bumps") is formed on a face of a component, typically the IC chip component, and the bumped component is brought into a face-to-face relationship with the other component. The two components are then heated (such as in a furnace) to reflow (heat, then allow to cool) the solder bumps, thereby making electrical connections between respective terminals of the two components.

A need for ever finer pitch arrays of solder balls has accompanied an increase in the circuit density of IC chips and multi-chip modules. For example, an IC chip to be flip-chip connected to an interconnection substrate may require an array of 4 mil (100 μm) diameter solder balls disposed at an 8 mil (200 μm) pitch.

Definitions

As used herein, the term "solder ball" refers to a substantially spherical or hemispherical mass (bump) of solder (e.g., lead-tin solder) resident on an substrate (e.g., electronic component), suitable for being re-flowed to join the electronic component to another electronic component. A "large solder ball" is a solder ball having a diameter of greater than 20 mils (>0.020 inches). A "small solder ball" is a solder ball having a diameter of up to 20 mils (<=0.20 inches).

The following units of length and their equivalents are used herein:
1 mil=0.001 inches
1 micron (μm)=0.000001 meters
25.4 μm=1 mil
1 millimeter (mm)=0.001 meters As used herein, the term "pitch" refers to a distance between centers of adjacent solder balls on pads of a substrate. "Coarse pitch" refers to a pitch which is at least 50 mils, and connotes a "low density" of solder balls. "Fine pitch" refers to a pitch which is up to 20 mils, and connotes a "high density" of solder balls.

For example, a typical "BGA" substrate has 30 mil diameter solder balls disposed at a 50 mil (coarse) pitch. A typical "μBGA" (microBGA) substrate has 15-20 mil diameter solder balls disposed at a 30 mil ("medium") pitch. A typical "flip chip" substrate has 4-5 mil diameter solder balls disposed at an 8-10 mil pitch.

As used herein, the term "electronic component" includes any circuitized substrate, typically having "pads", including but not limited to integrated circuit (IC) chips (including prior to or after singulation from a semiconductor wafer), printed circuit boards, polyimide interconnection elements, ceramic substrates, and the like.

As used herein, a "substrate" is an electronic component having a nominally flat surface upon which it is desirable to form solder balls to effect electrical connections to another electronic component. "Wafer substrates" are substrates (or electronic components) which are semiconductor (crystalline, typically silicon) wafers. Any substrate which is not a wafer substrate is an "other substrate". Ball grid array (BGA) substrates are other substrates.

As used herein, the terms "substrate bumping" and "ball bumping" refer to a process for forming solder balls on substrates. As used herein, "bumping machines" comprise equipment adapted to perform substrate bumping.

Ball Bumping Techniques

A number of techniques are known for ball bumping electronic components, some of which are not well suited to fine pitch ball bumping.

In an evaporation technique, solder is evaporated through a metal mask in an evacuated chamber. This requires a high investment in capital equipment and has high cost associated with cleaning the processing equipment and with replacing the metal mask on a frequent basis. Thermal mismatch between the evaporation mask and the substrate being ball bumped tends to limit the usefulness of the technique to moderate densities and moderate solder bump sizes.

Electroplating techniques have been used to achieve higher densities and smaller bump sizes. In this technique, the substrate surface is covered with an electroplating seed layer, then masked with photoresist which is patterned and developed to form an electroplating mold over each substrate pad. The seed layer is then electroplated, filling the molds, and the photoresist and vestigial seed layer are thereafter stripped (etched away), leaving behind the plated bumps. This technique is time consuming, requires high capital expenditure, and involves hazardous chemicals.

In the stenciling technique, a stencil having apertures therein is placed over the substrate with the apertures overlying corresponding pads of the substrate. As the stencil is held in place, an amount of solder paste is dispensed onto the stencil, and a screening blade (sometimes called a "doctor blade") is moved across the stencil surface in a manner to force solder paste into the stencil apertures. The stencil is then removed, which leaves behind bodies of solder paste on the pads, and the bodies are thereafter reflowed to form solder bumps on the substrate. This technique is relatively inexpensive, and comprises only a few quick steps, but is generally not well suited to small bump sizes and high bump densities.

Conventional solder paste typically contains tiny particles of solder material (lead/tin), in a matrix of flux, and comprises about 30% (by volume) solid material.

U.S. Pat. No. 5,539,153 ("Hewlett Packard"), incorporated in its entirety by reference herein, discloses a method of bumping substrates by contained paste deposition. A non-wettable metal mask (stencil) is disposed on a substrate such that a plurality of apertures in the mask align with a plurality of pads on the substrate. The apertures are filled with solder paste in a manner comparable to that which was described hereinabove with respect to the stenciling technique. The solder paste is then reflowed with the mask in place. After reflow, the mask is removed.

U.S. Pat. No. 5,492,266 ("IBM-1"), incorporated in its entirety by reference herein, discloses a process for forming solder on select contacts of a printed circuit board (PCB), and is generally similar to the aforementioned Hewlett Packard Patent. A non-wettable stencil having openings is positioned on the board, the openings are filled with solder paste and, with the stencil fixedly positioned on the board, the solder paste retained by the stencil pattern is reflowed to selectively form on the underlying contacts of the printed circuit board.

U.S. Pat. No. 5,658,827 ("IBM-2"), incorporated in its entirety by reference herein, discloses a method for forming solder balls on a substrate. The solder balls are formed by squeegeeing solder paste through apertures in a fixture into contact with pads on a substrate, and heating the fixture, paste and substrate to reflow the solder paste into solder balls that attach to the pads and are detached from the fixture. After cooling, the fixture is separated from the substrate. In an embodiment of the method, the fixture and substrate are inverted, and another surface mount electrical component is placed on the opposite surface of the substrate prior to heating the substrate.

The aforementioned Hewlett Packard, IBM-1 and IBM-2 patents all describe printing solder paste through a mask or stencil onto a substrate, and reflowing the solder paste with the stencil in place on the substrate. In each case, the cells formed by the stencil apertures/openings are open on one side (the side of the stencil opposite the side in contact with the substrate). No admission is made herein that the inverted technique described in the IBM-2 patent would actually work as described.

The aforementioned "parent" U.S. patent application Ser. No. 08/863,800 (U.S. Pat. No. 5,988,487), discloses CAPTURED-CELL SOLDER PRINTING AND REFLOW METHODS AND APPARATUSES. Generally, a screening stencil is laid over the surface of the substrate and solder paste material is deposited into the stencil's apertures with a screening blade. The stencil is placed in such a manner that each of its apertures is positioned over a substrate pad upon which a solder bump is to be formed. Next, a flat pressure plate is laid over the exposed top surface of the stencil, which creates a fully enclosed (or "captured") cell of solder material within each stencil aperture. Then, with the stencil and plate remaining in place on top of the substrate, the substrate is heated to a temperature sufficient to reflow the solder material. After reflow, the substrate is cooled, and the pressure plate and stencil are thereafter removed, leaving solder bumps on the substrate pads. The use of the pressure plate ensures proper formation of the solder bumps at high densities of solder bumps (i.e., high densities corresponding to small solder bump sizes and small pitch distances between solder bumps).

An example of a substrate having solder balls on a surface thereof is the Ball Grid Array (BGA) package. The advent and popularity of the BGA package has brought with it several new package manufacturing and assembly problems. One of the more significant problems is finding an efficient, cost-effective technique for applying the solder balls to the package surface. The package surface is usually formed from an electrically insulating material (e.g., printed circuit board material) with a pattern of metallized pads disposed thereupon within the package. Several methods are currently used to form solder balls on these package pads.

One method of forming solder balls on package pads involves the application of solder flux to the package pads, then placing preformed solder balls onto the package pads, either individually or en masse, with the aid of a fixture or a "pick-and-place" apparatus similar to those used for circuit board assembly. The package is then heated to the melting point of the solder ball alloy which will then wet the metallic surface of the pads and join thereto. This pick-and-place method required the precision handling of massive qualities of solder balls. As the connection counts of package increase, hundreds or even thousands of balls must be manipulated in this fashion for each package.

An alternative method of disposing solder balls on package pads involves using a printing or dispensing fixture to apply measured quantities of solder paste (a mixture of fine solder particles in a flux-containing medium) to the package contact pads. Upon exposure to heat, the solder melts and surface tension causes the solder to assume a generally spherical shape. Once cooled, the spherical shapes form ball bumps (solder balls) on the package. Evidently, solder ball contacts formed in this manner, being generally spherical, will exhibit a 1:1 aspect ratio of height-to-width. Even if hemispherical, the solder ball contacts will have a height:width ratio on the order of 0.5:1. In certain applications, it would be desirable that the external package contacts have a height:width ratio in excess of 1:1 (e.g., 2:1).

Another technique for disposing solder balls on package pads involves using printed solder paste, then placing a pre-formed ball, which is essentially a combination of the two techniques described hereinabove. In this technique, solder is printed onto the contact pads to form an "adhesive" on the contact pad, then a pre-formed solder ball is placed onto the contact pad and the package is heated to reflow the solder paste, thereby joining the pre-formed solder balls to the pads.

Difficulties with any technique involving measuring or dispensing precise quantities of solder paste on pads to form ball bumps include dealing with the rheological characteristics (elasticity, viscosity, plasticity) of the solder paste, accurately controlling the volume of solder paste after dispensing and reflow, and the shape of the final ball bump. The shape of the ball bump can be affected by such factors as surface tension of the molten solder and the amount of wettable expose metal area of the contact pad.

The generally spherical shape assumed by solder balls formed as described hereinabove inherently prevents the formation of "tall" (high aspect ratio) ball bumps by ordinary means. This is a limiting characteristic because, in certain applications, tall solder bumps can be used to great advantage in reflow assembly (e.g., of a packaged semiconductor device to a printed circuit board). As mentioned above, in general it is difficult to form contacts with height-to-width ratios (aspect ratios) of greater than 1:1. Some techniques involving "building up" of solder contact height in a series of process steps have managed to produce tall (high aspect ratio) contacts, but such techniques are typically expensive and cumbersome in high-volume production.

Consistency in the height of solder ball contacts is another critical factor for successful assembly of BGA type packages to circuit boards. If one or more of the solder balls are significantly shorter than others (usually due to an insufficient amount of solder paste deposited on one or more conductive pads prior to contact formation) it becomes highly likely that these smaller (shorter) contacts will completely miss their mating contact pads (on the circuit board) and will fail to form an electrical connection between the packaged semiconductor device and the underlying substrate (e.g., printed circuit board). Hence, quality control for BGA packages is critical, since proper electrical connections between the BGA package and the substrate to which it is assembled are formed only if each and every one of the solder ball contacts reflows correctly and wets its associated conductive pad on the substrate. Defective assemblies of packages to interconnection substrates can be difficult or impossible to repair after assembly if connections are not properly formed. Even prior to assembly, the correction of improperly formed solder balls on the exterior of a package can be very difficult and involves, initially, careful quality control inspection of the ball bumps prior to assembly of the packaged device to a substrate.

As the volume of packages produced by the aforementioned methods increases, the complexity of the manufacturing processes becomes an obstacle to high manufacturing rates. In order to avoid high scrap rates, high machine accuracy must be maintained, raw material properties (e.g., solder paste and pad metal) must be carefully controlled, and numerous process parameters (e.g., amount of solder paste dispensed, size of conductive pads, temperature, shape and size of ball contact) must be monitored.

Further complicating matters, in order to accommodate different package configurations (e.g., different size packages, different array spacing of the ball bump contacts, etc.), it may be necessary to change numerous parts of the manufacturing equipment (tooling). Generally speaking, complicated setup and tooling changes tend to increase downtime, thereby increasing production cost.

Information Disclosure

The following U.S. patents are cited as being of particular interest, and are incorporated in their entirety by reference herein.

| DOC. NO. | DATE | NAME | CLASS | SUBCL |
|---|---|---|---|---|
| 6,153,505 | November 2000 | Bolde, et al. | 438 | 613 |
| 6,126,059 | October 2000 | Mackay, et al. (div of '487) | 228 | 9 |
| 6,109,175 | August 2000 | Kinoshita | 101 | 170 |
| 6,051,273 | April 2000 | Dalal, et al. | 427 | 124 |
| 6,008,071 | December 1999 | Karasawa, et al. | 438 | 115 |
| 5,988,487 | November 1999 | Mackay, et al. (parent case) | 228 | 254 |
| 5,950,908 | September 1999 | Fujino, et al. | 228 | 248.1 |
| 5,934,545 | August 1999 | Gordon | 228 | 191 |
| 5,877,079 | March 1999 | Karasawa, et al. | 438 | 613 |
| 5,842,626 | December 1998 | Bhansali, et al. | 228 | 180.22 |
| 5,829,668 | November 1998 | George, et al. | 228 | 254 |
| 5,806,753 | September 1998 | Bielick, et al. | 228 | 248.1 |
| 5,782,399 | July 1998 | Lapastora | 228 | 41 |
| 5,773,897 | June 1998 | Wen, et al. | 257 | 778 |
| 5,759,269 | June 1998 | Cutting et al. | 118 | 213 |
| 5,667,128 | September 1997 | Rohde, et al. | 228 | 49.5 |
| 5,658,827 | August 1997 | Aulicino, et al. ("IBM-2") | 228 | 180.22 |
| 5,632,434 | May 27, 1997 | Evans, et al. | 229 | 44.7 |
| 5,539,153 | July 1996 | Schwiebert, et al. ("HP") | 174 | 260 |
| 5,492,266 | February 1996 | Hoebner, et al. ("IBM-1") | 228 | 248.1 |
| 5,439,164 | August 1995 | Hasegawa, et al. | 228 | 194 |
| 5,366,760 | November 1994 | Fujii, et al. | 427 | 96 |
| 5,310,574 | May 1994 | Holtmann | 427 | 58 |
| 5,197,655 | March 1993 | Leerssen, et al. | 228 | 254 |
| 5,172,469 | December 1992 | Onda, et al. | 29 | 762 |
| 5,079,835 | January 1992 | Lam | 29 | 840 |
| 5,014,162 | January 1991 | Clark, et al. | 361 | 412 |

BRIEF DISCLOSURE (SUMMARY) OF THE INVENTION

It is an object of the invention to provide an improved process for forming solder balls on electronic components.

Generally, according to the invention, an electronic component substrate is processed ("ball bumped") to form a plurality of solder balls on a corresponding plurality of pads on the substrate. A mask (stencil) having a plurality of openings (cells) is disposed on the surface of a heater stage and is printed (filled with solder paste). Then, the assembly of mask and heater stage is shuttled over to a substrate having pads (e.g., a wafer) which is in a chuck. The filled openings of the mask are aligned over the corresponding plurality of pads on the substrate.

The mask is held in intimate contact with the heater stage and with the wafer. The cells are therefore "closed" or captured. Then the heater stage is heated to reflow the solder paste and form solder balls. Reflow may also be performed in an inverted or in a partially-inverted orientation. The mask may be removed from the wafer (or vice versa) while still molten.

More specifically, according to the invention claimed herein, method and apparatus are provided for forming solder bumps on a substrate having a plurality of pads on a surface thereof, comprising a biased chuck assembly which urges the substrate into positive contact with the mask so as to maintain substantially intimate contact between a surface of the mask and the surface of the substrate.

The process of the present invention is capable of achieving high densities of small solder balls, and is readily scaleable to lower densities of large solder balls. The process proceeds relatively quickly, with low capital expenditure equipment, and without hazardous chemicals.

The present invention provides a fast, low-cost, robust, non-capital-intensive method and apparatus for forming arrays of solder bumps at moderate to high densities on electronic components, including 150 µm area arrays, 200 µm area arrays, and 250 µm area arrays, forming solder balls at 0.5 mm pitch and at 0.8 mm pitch.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

Certain elements in selected ones of the drawings may be illustrated not-to-scale, for illustrative clarity.

Often, similar elements throughout the drawings may be referred to by similar references numerals. For example, the element 199 in a figure (or embodiment) may be similar in many respects to the element 299 in an other figure (or embodiment). Such a relationship, if any, between similar elements in different figures or embodiments will become apparent throughout the specification, including, if applicable, in the claims and abstract.

In some cases, similar elements may be referred to with similar numbers in a single drawing. For example, a plurality of elements 199 may be referred to as 199a, 199b, 199c, etc.

The cross-sectional views, if any, presented herein may be in the form of "slices", or "near-sighted" cross-sectional views, omitting certain background lines which would otherwise be visible in a true cross-sectional view, for illustrative clarity.

The structure, operation, and advantages of the present preferred embodiment of the invention will become further apparent upon consideration of the following description taken in conjunction with the accompanying drawings.

Figure 1:
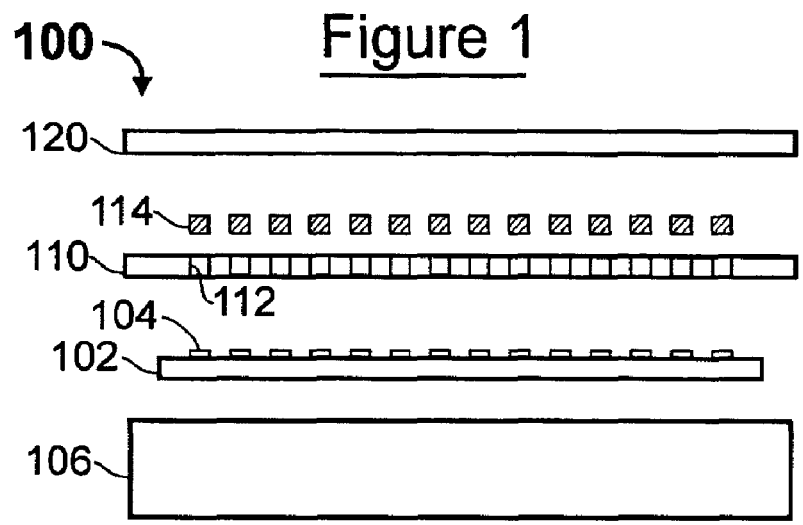

FIG. 1 is an exploded cross-sectional view of a method and apparatus for forming solder balls on substrates, according to patent application Ser. No. 08/863,800 (U.S. Pat. No. 5,988,487).

Figure 1A:
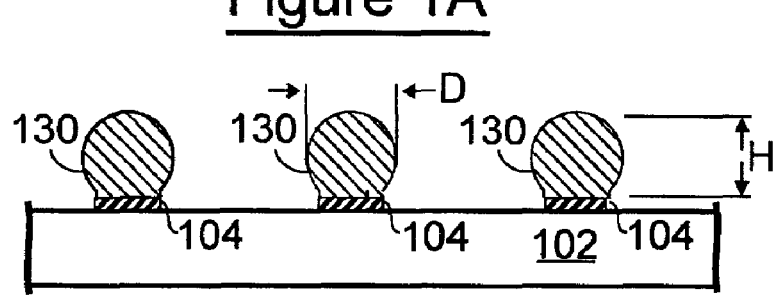

FIG. 1A is an enlarged (magnified) view of the substrate (102) shown in FIG. 1, after completion of ball bumping.

Figure 1B:
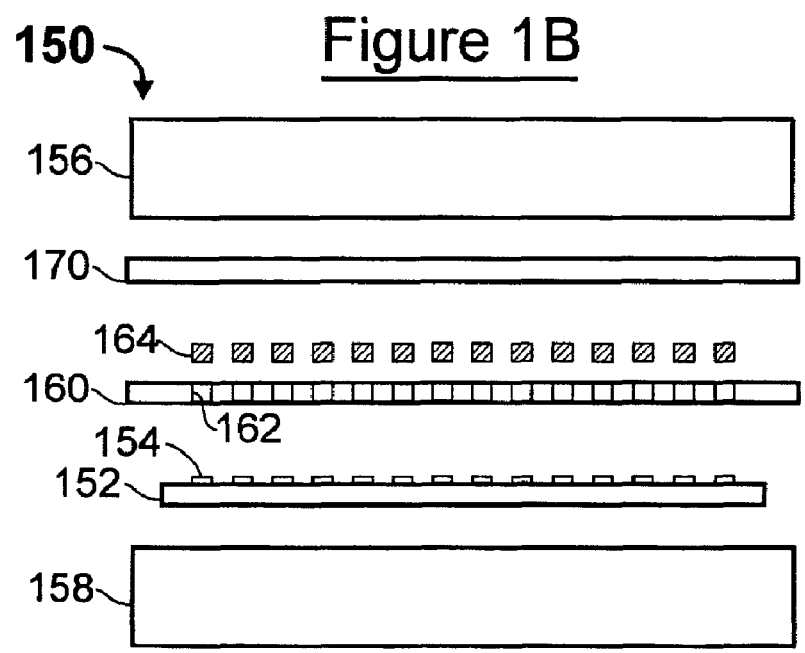

FIG. 1B is an exploded cross-sectional view of an alternate embodiment of a method and apparatus for forming solder balls on substrates.

FIG. 1C is a top plan view of a substrate with bond pads.

FIG. 1D is a side cross-sectional view of the substrate of FIG. 1C, with solder balls on the bond pads.

FIG. 1E is a side cross-sectional view of the substrate of FIG. 1C, orthogonal to the view of FIG. 1D, showing the solder balls on the bond pads.

FIG. 2A is a side cross-sectional view of another technique for forming solder balls on a surface of a substrate.

FIG. 2B is a side cross-sectional view of another technique for forming solder balls on a surface of a substrate.

Figure 3A:
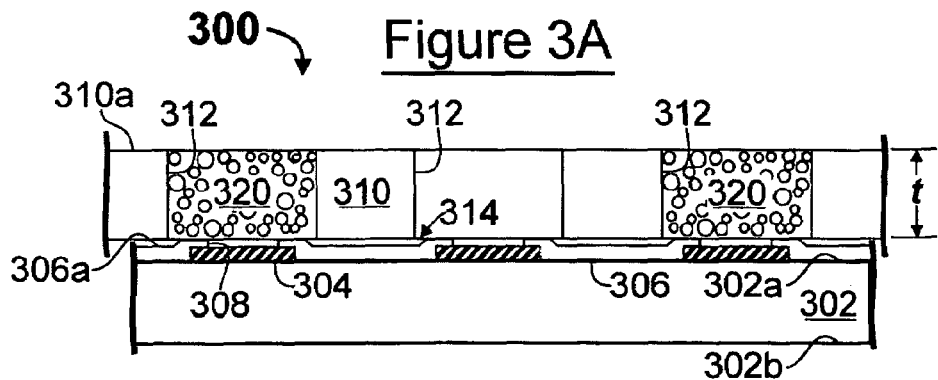

FIG. 3A is a side cross-sectional view of an alternate embodiment of a technique for ball-bumping a substrate, according to the invention.

Figure 3B:
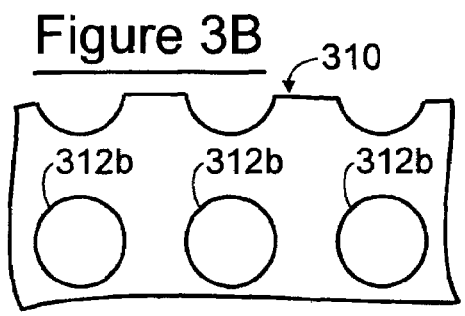

FIG. 3B is a top plan view of a mask (stencil) used in the technique of FIG. 3A, according to the invention.

Figure 3C:
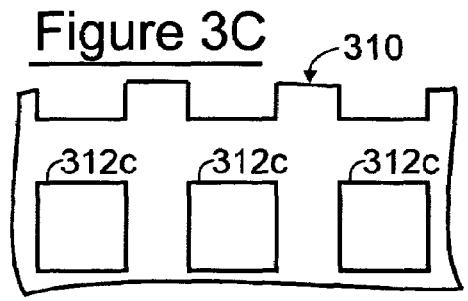

FIG. 3C is a top plan view of an alternate embodiment of a mask (stencil) used in the technique of FIG. 3A, according to the invention.

Figure 3D:
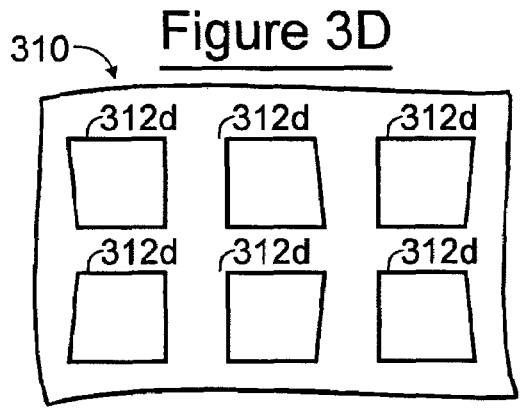

FIG. 3D is a top plan view of another alternate embodiment of a mask (stencil) used in the technique of FIG. 3A, according to the invention.

Figures 3I, 3J:
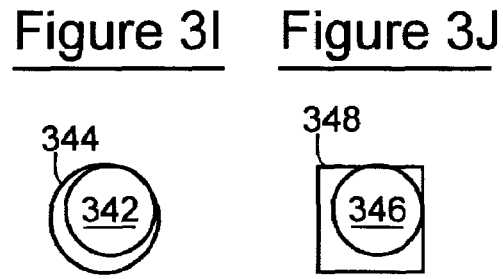
Figure 3E:
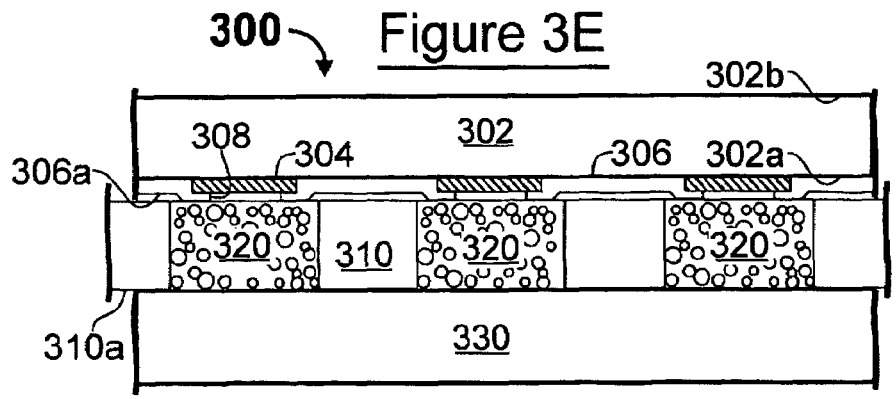

FIG. 3E is a side cross-sectional view of a further step in the technique for ball-bumping a substrate, according to the invention.

FIG. 3F is a side cross-sectional view of a further step in the technique for ball-bumping a substrate, according to the invention.

FIG. 3G is a side cross-sectional view of a further step in the technique for ball-bumping a substrate, according to the invention.

FIG. 3H is a side cross-sectional view of a ball-bumped substrate which has been formed according to the invention.

FIG. 3I is a schematic illustration of a top plan view of a ball in a cell of a mask, such as the mask of FIG. 3B.

FIG. 3J is a schematic illustration of a top plan view of a ball in a cell of a mask, such as the mask of FIG. 3C.

FIG. 4 is a schematic diagram of a machine for ball bumping substrates, according to the invention.

FIGS. 4A-4B are schematic diagrams of a process flow for ball bumping substrates, using the machine of FIG. 4, according to the invention.

FIG. 4C is a schematic diagram of an alternate embodiment of a process flow for ball bumping substrates, using the machine of FIG. 4, according to the invention.

FIG. 4D is a schematic diagram of an alternate embodiment of a process flow for ball bumping substrates, using the machine of FIG. 4, according to the invention.

FIG. 4E is a partial cross-sectional view of a substrate being bumped according to the inventive technique of FIG. 4D.

Figure 5A:
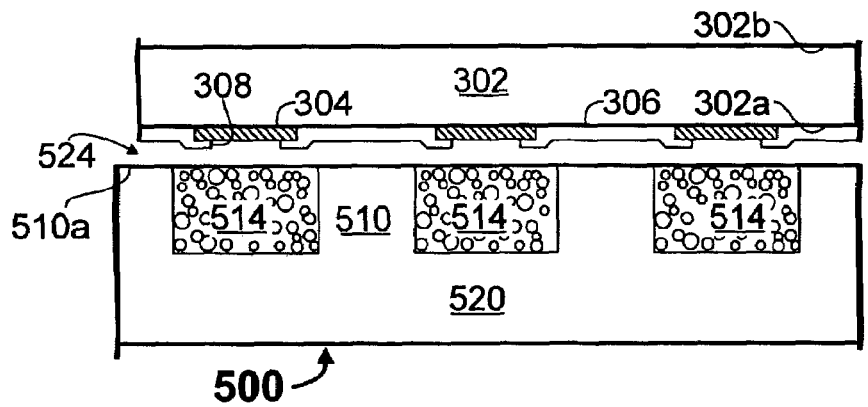

FIG. 5A is a side cross-sectional view illustrating a "composite" mask, according to the invention.

Figure 5B:
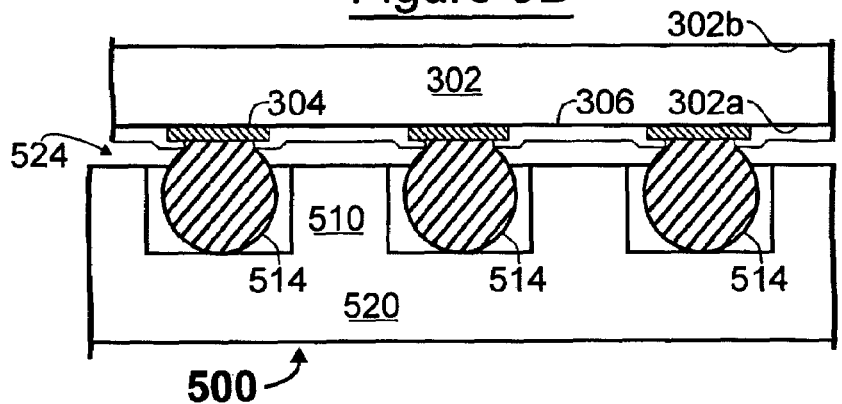

FIG. 5B is a side cross-sectional view illustrating a "bridge the gap" feature of the present invention.

Figure 5C:
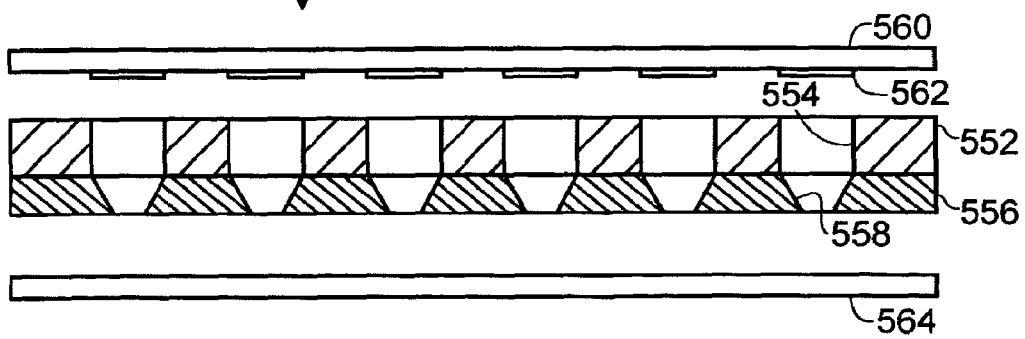

FIG. 5C is an exploded side cross-sectional view illustrating a "stacking masks" feature of the present invention.

Figure 6A:
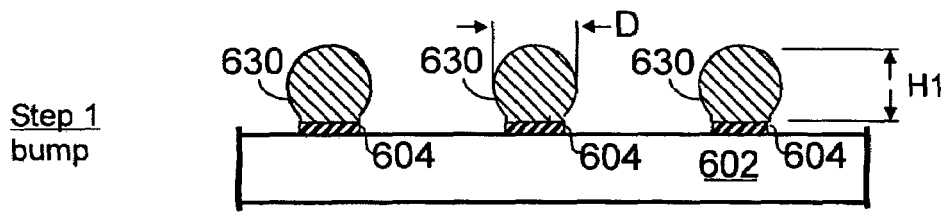

FIG. 6A is a side cross-sectional view of a first step of a process of forming tall, high aspect reflowable interconnect structures, according to the invention.

Figure 6B:
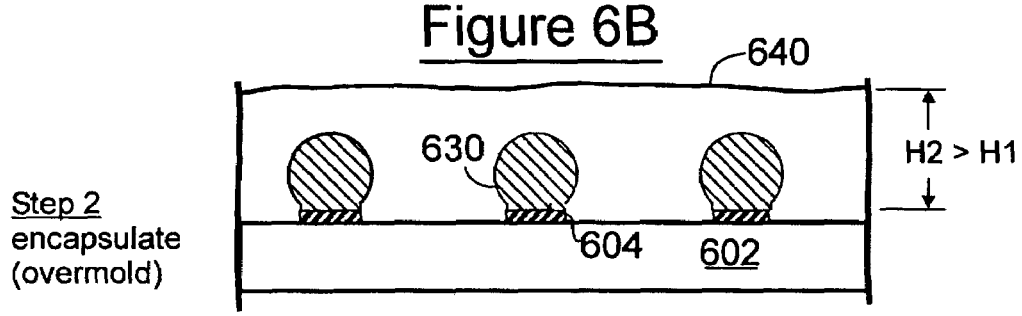

FIG. 6B is a side cross-sectional view of a next step of the process of forming tall, high aspect reflowable interconnect structures, according to the invention.

Figure 6C:
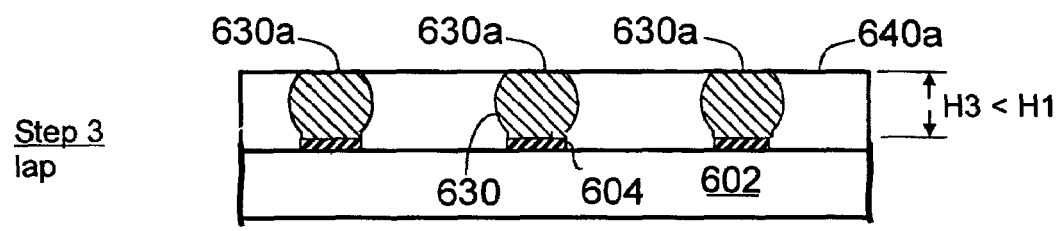

FIG. 6C is a side cross-sectional view of a next step of the process of forming tall, high aspect reflowable interconnect structures, according to the invention.

Figure 6D:
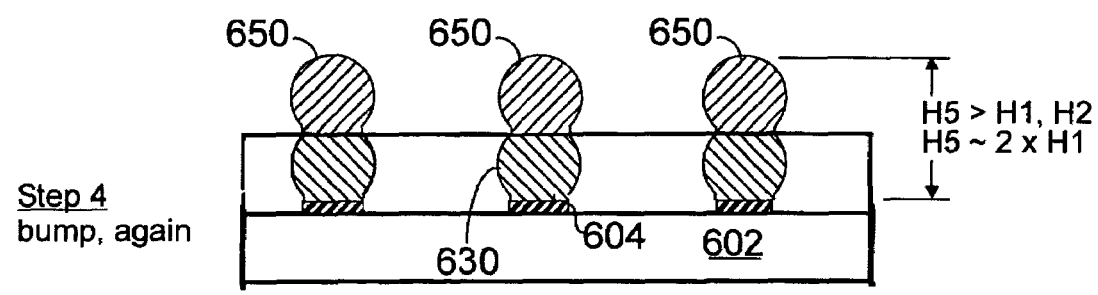

FIG. 6D is a side cross-sectional view of a next step of the process of forming tall, high aspect reflowable interconnect structures, according to the invention.

FIG. 7A is a top plan view of a substrate with bond pads.

FIG. 7B is a side cross-sectional view of the substrate of FIG. 7A, with solder bumps on the bond pads.

FIG. 7C is a side cross-sectional view of the substrate of FIG. 7A, orthogonal to the view of FIG. 7B, showing the solder bumps on the bond pads.

FIG. 7D is a top plan view of a substrate with bond pads.

FIG. 7E is a side cross-sectional view of the substrate of FIG. 7D, with solder bumps on the bond pads.

FIG. 7F is a side cross-sectional view of the substrate of FIG. 7D, orthogonal to the view of FIG. 7B, showing the solder bumps on the bond pads.

FIG. 7G is a top plan view of a substrate with bond pads.

FIG. 7H is a side cross-sectional view of the substrate of FIG. 7G, with solder balls on the bond pads.

FIG. 7I is a side cross-sectional view of the substrate of FIG. 7G, orthogonal to the view of FIG. 7B, showing the solder balls on the bond pads.

Figure 8A:
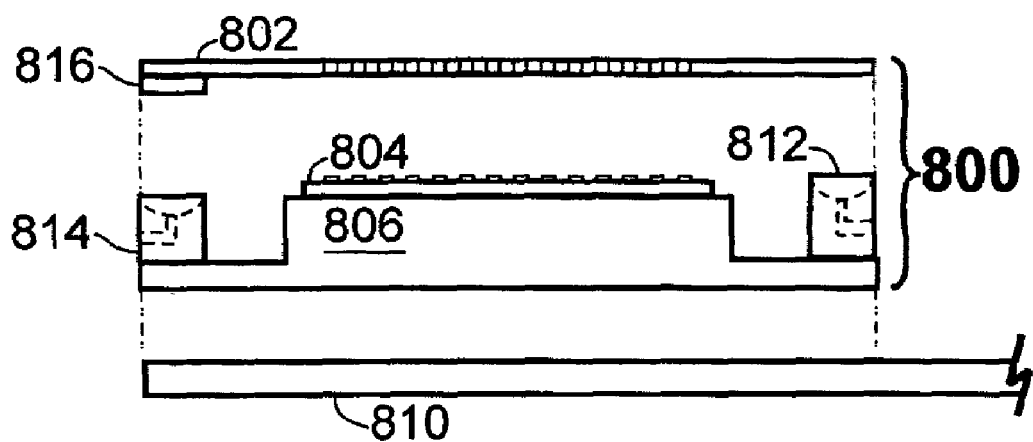

FIG. 8A is an exploded side cross-sectional view of an alternate embodiment of a mask mounting technique, according to the invention.

Figure 8B:
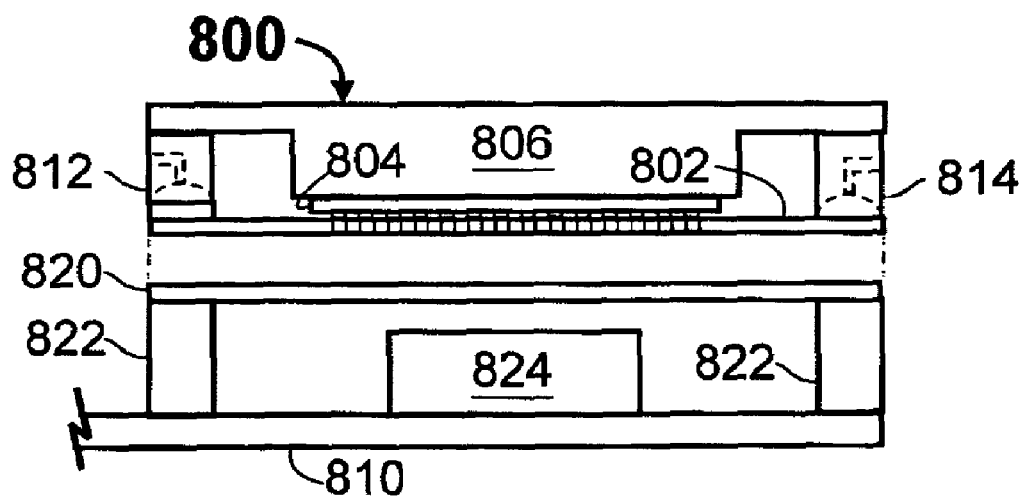

FIG. 8B is a partially exploded side cross-sectional view of a technique for capturing the cells of the mask illustrated in FIG. 8A.

Figure 9:
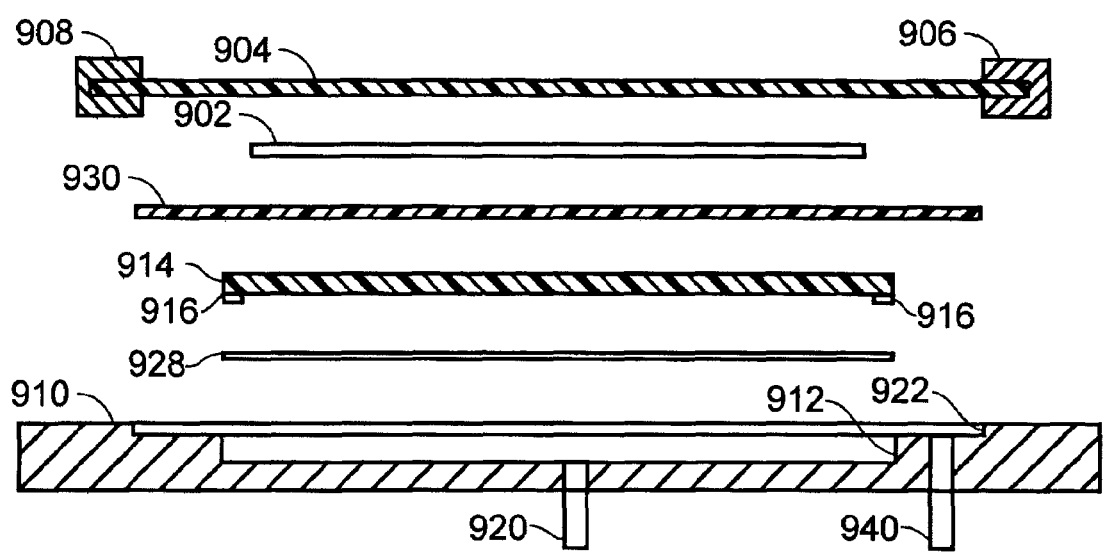

FIG. 9 is an exploded side cross-sectional view of a chuck assembly for holding a substrate which is a semiconductor wafer, according to the invention.

Figure 9A:
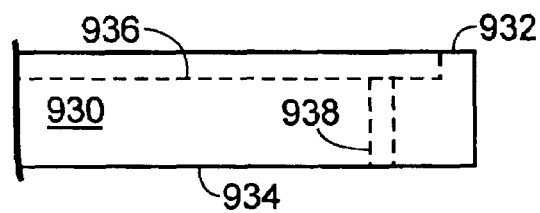

FIG. 9A is a magnified cross-sectional view of a component of the chuck assembly of FIG. 9.

Figure 10:
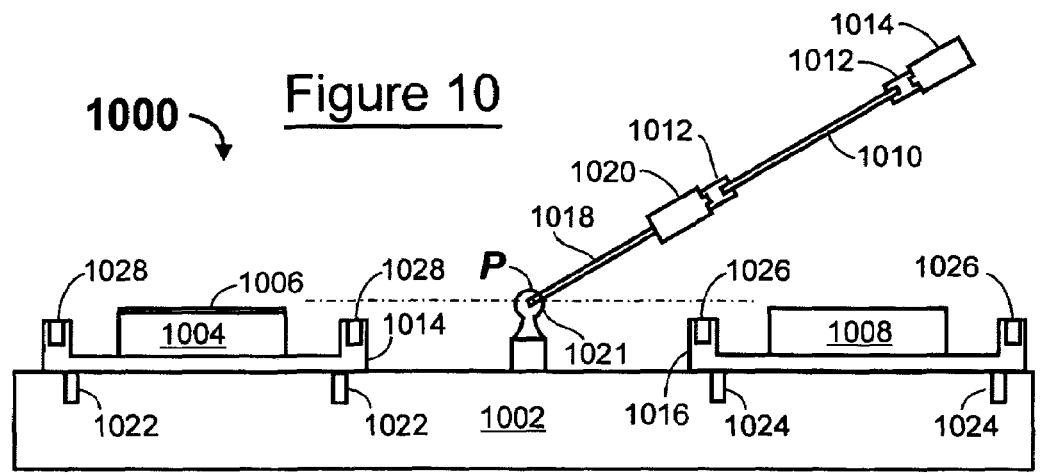

FIG. 10 is a schematic side view of a ball bumping machine of the present invention.

Figure 10A:
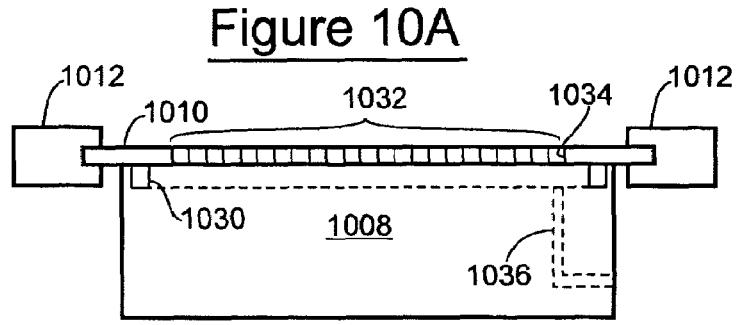

FIG. 10A is a schematic side view of a heater stage of the present invention.

Figure 10B:
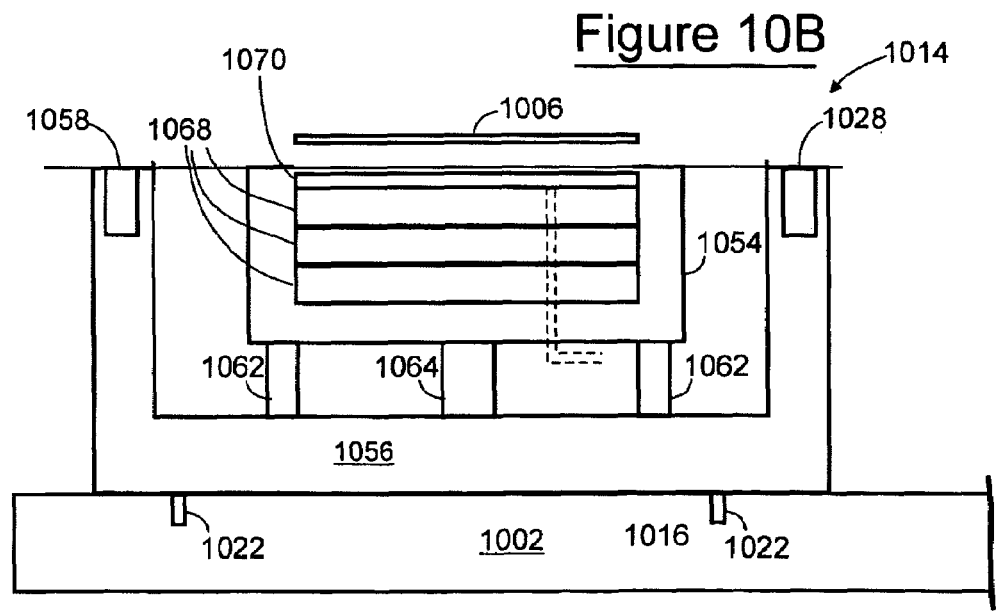

FIG. 10B is a schematic cross-sectional view of a chuck assembly of the present invention.

Figure 10C:
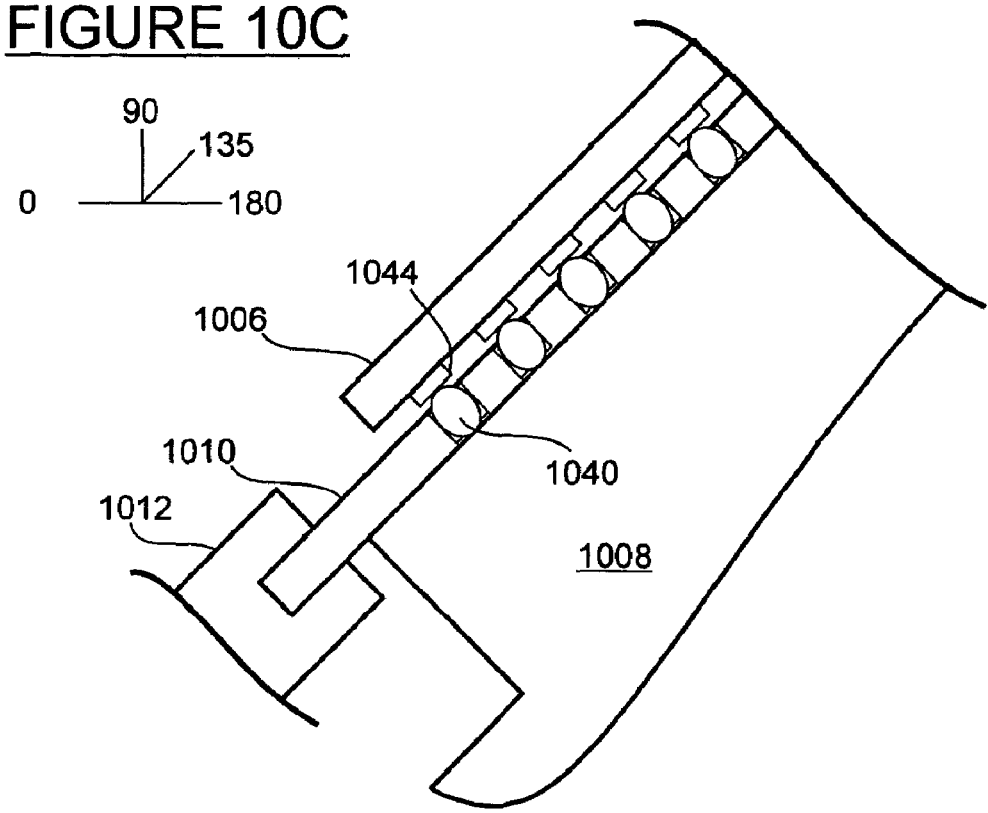

FIG. 10C is a schematic cross-sectional view of a wafer being ball bumped, partially inverted, according to the invention.

Figure 10D:
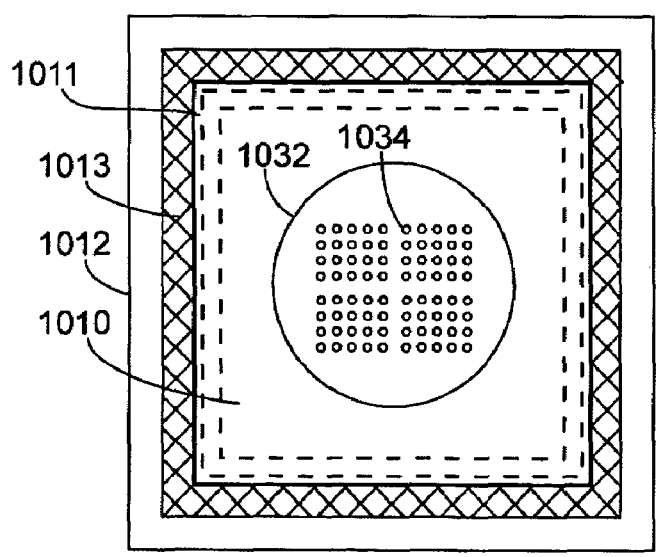

FIG. 10D is a plan view of a mask, and its mounting arrangement, according to the invention.

Figure 11A:
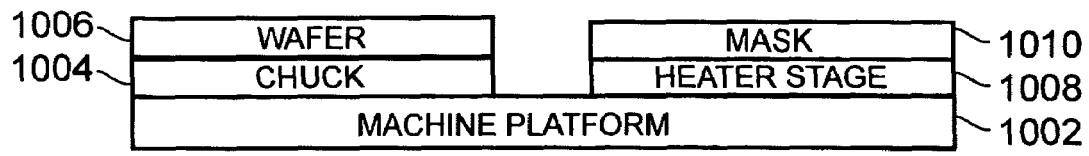
Figure 11B:
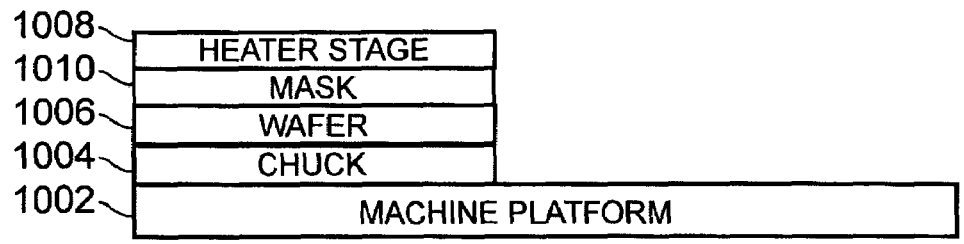
Figure 11C:
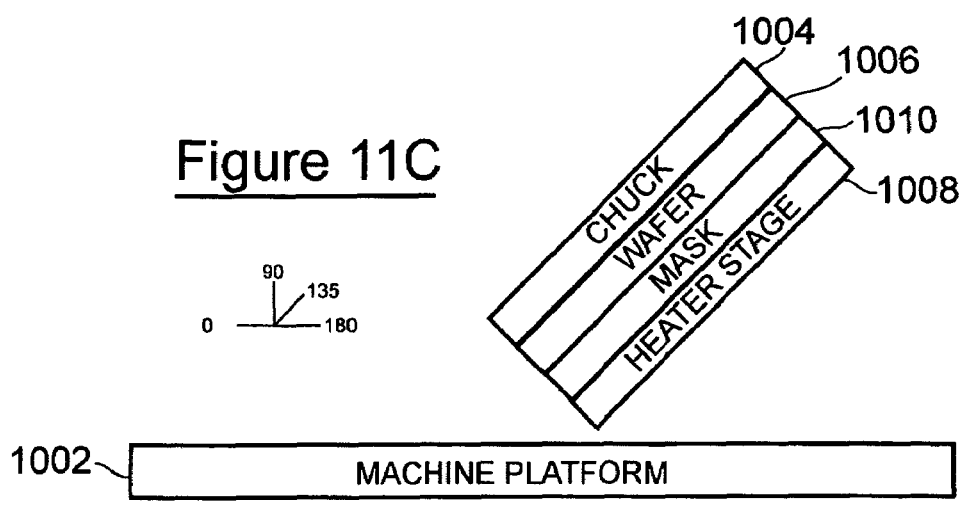

FIGS. 11A-11C are schematic diagrams of a process flow for ball bumping substrates, using the machine of FIG. 4, according to the invention.

Figure 12:
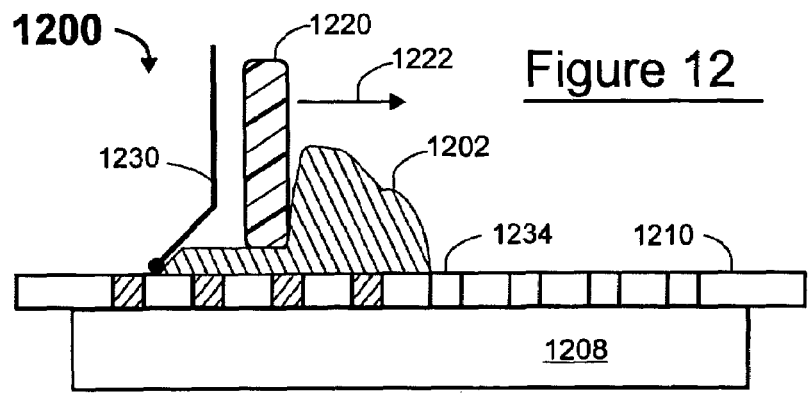

FIG. 12 is a side, cross-sectional view of a technique for applying solder paste to cells in a mask, according to the invention. See FIG. 2 of U.S. Ser. No. 10/630,310 filed Jul. 30, 2003.

Figure 13:
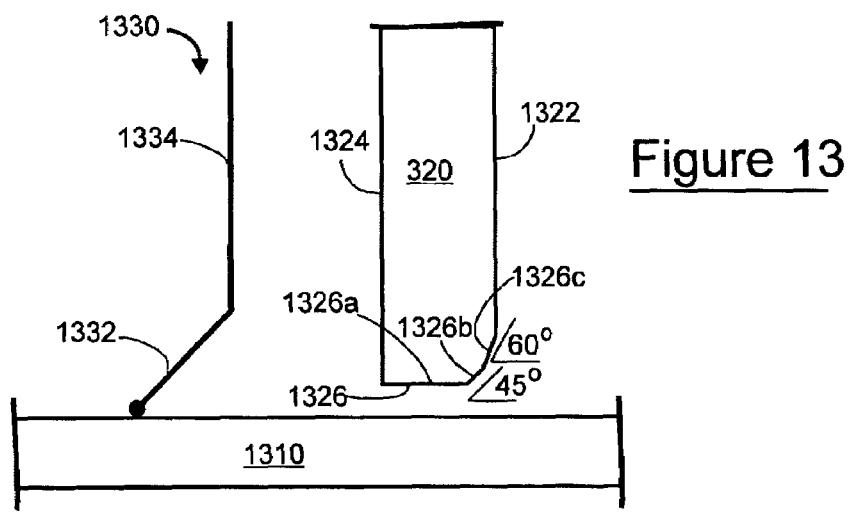

FIG. 13 is a side, cross-sectional view of a set of blades, such as those shown in FIG. 12, according to the invention. See FIG. 3 of U.S. Ser. No. 10/630,310 filed Jul. 30, 2003.

Figure 14:
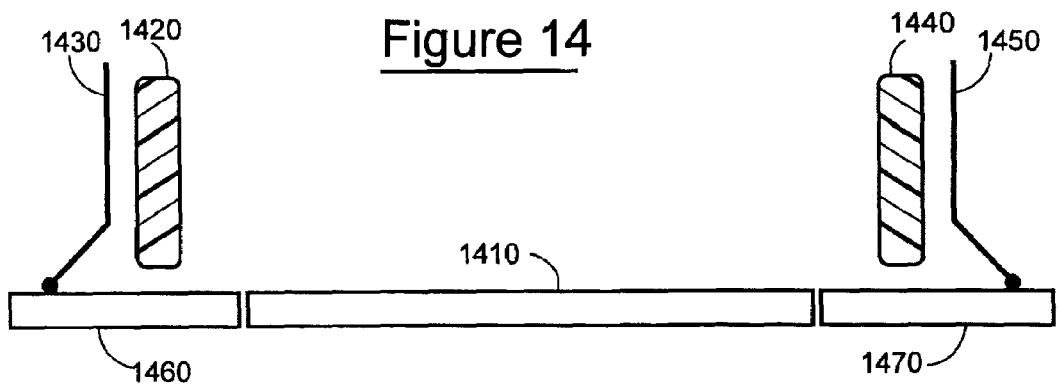

FIG. 14 is a schematic side view of two sets of blades, such as those shown in FIG. 12, according to the invention. See FIG. 4 of U.S. Ser. No. 10/630,310 filed Jul. 30, 2003.

DETAILED DESCRIPTION OF THE INVENTION

FIG. 1 illustrates a technique 100 for forming solder balls on a surface of a substrate 102, such as is set forth in "parent" U.S. patent application Ser. No. 08/863,800 (U.S. Pat. No. 5,988,487, Nov. 23, 1999), incorporated in its entirety by reference herein.

The substrate 102 has number of pads 104 on its top (as viewed) surface. The pads 104 are typically arranged in an array, having a pitch (center-to-center spacing from one another). The substrate 102 is disposed atop a heater stage 106.

A mask (stencil) 110 is provided. The mask 110 is a thin planar sheet of relatively stiff material, such as molybdenum, having a plurality of openings (cells) 112, each corresponding to a pad 104 whereupon it is desired to form a solder ball on the substrate 102.

The mask 110 is placed on the top (as viewed) surface of the substrate 102 with the cells 112 aligned over the pads 104. The cells 112 in the mask 110 are filled with solder material 114. This is done in any suitable manner such as by smearing solder material on the top (as viewed) surface of the mask 110 and squeegeeing the solder material 114 into the cells 112 of the mask 110.

A typical solder paste contains particles of lead/tin solder, in a matrix of flux, with the following proportions: 80% (by weight) solid material (e.g., particles of lead/tin solder), and 20% (by weight) flux (including volatiles). In terms of relative volume percentages, the same typical solder paste may contain approximately 55% (by volume) of solid material (metal) and 45% (by volume) of flux. As discussed in greater detail hereinbelow, it is preferred that a "solder material" be used in lieu of regular solder paste.

It is within the scope of the invention that the cells 112 in the mask 110 are filled with solder material prior to placing the mask 110 on the top surface of the substrate, in which case the solder-material-filled cells 112 would be aligned over the pads 104.

A pressure plate 120 is disposed onto the top (as viewed) surface of the mask 110. This holds the mask 110 down onto the substrate 102, and the substrate 102 down onto the heater stage 106. This also closes off the cells 112—hence, the terminology "captured cell".

The heater stage 106 is heated up, typically gradually, to a temperature sufficient to cause the solder material in the cells 112 to melt (reflow). When the solder material melts, the individual solder particles will merge (flow) together and, due to surface tension, will try to form (and, typically, will form) a sphere.

When the solder material re-solidifies, it assumes a general spherical or hemispherical shape. The mask 110 is then removed from the substrate 102.

FIG. 1A is an enlarged (magnified) view of the substrate 102 shown in FIG. 1, after completion of ball bumping. Herein it can be observed that the solder balls 130 are generally spherical, have a diameter "D" and have a height "H". See also FIGS. 1C,1D,1E, below.

The aforementioned "parent" U.S. patent application Ser. No. 08/863,800 (U.S. Pat. No. 5,988,487) describes exemplary substrate heating programs (profiles, recipes) in terms of temperature as a function of time.

A drawback of the technique 100 is that no provision is made for "out gassing" of volatiles when the solder material is reflowed.

Another drawback of the technique 100 is that heat is directed through the substrate 102.

FIG. 1B illustrates an alternate technique 150 (compare 100) for forming solder balls on a surface of a substrate 152 (compare 102).

The substrate 152 has number of pads 154 (compare 104) disposed on its top (as viewed) surface. The substrate 152 is disposed atop a chuck (base) 158, rather than atop a heater stage (106).

A mask (stencil) 160 (compare 110) having cells 162 (compare 112) filled with solder material 164 (compare 114) is disposed on the surface of the substrate 152 with the cells 162 aligned with the pads 154. The cells 162 may be pre-filled or filled with the mask 160 atop the substrate 152.

A pressure plate 170 (compare 120) is disposed onto the top (as viewed) surface of the mask 160. This holds the mask 160 down onto the substrate 152, and the substrate 152 down onto the chuck base 158. This also closes off the tops of the cells 162.

A heater stage 156 (compare 106) is disposed onto the top (as viewed) surface of the pressure plate 170. The heater stage 106 is heated up, typically gradually, to a temperature sufficient to cause the solder material in the cells 162 to reflow. When the mask 160 is removed, solder balls such as those (130) shown in FIG. 1A will be present on the pads 154.

A drawback of the technique 150 is that no provision is made for "out gassing" of volatiles when the solder material is reflowed. However, in contrast to the technique 100, the technique 150 directs heat through the pressure plate 170 rather than through the substrate 152.

FIG. 2A illustrates a technique 200 for forming solder balls on a surface of a substrate 202. The substrate 202 has a top surface 202a and a bottom surface 202b.

In this example, forming solder balls on an external surface of substrate (or board) which is a BGA substrate (board) is discussed as exemplary of forming solder balls on (ball-bumping) a substrate. It should, however, be understood that the techniques described herein have applicability to ball bumping other substrates, such as semiconductor wafers.

A typical BGA substrate 202 has a plurality of contact pads 204 on its surface, each of which measures 35 mils across. In the typical case of round contact pads, each pad would be 35 mils in diameter. These contact pads 204 are typically spaced 50 mils (center-to-center) apart from one another. Often, the pad-surface 202a of the substrate is covered by thin (e.g., 2 mil) layer of insulating material 206, such as a polymer, which has openings 208 aligned with (centered over) the pads 204. The insulating material 206 has a top surface 206a.

The openings 208 in the insulating material 206 are typically somewhat smaller in size (area) than the pads 204—for example, each opening measuring only 30 mils across. Evidently then, the top surface 202a of the BGA substrate 202 will be quite irregular, exhibiting peaks where the insulating material 206 overlaps the pads 204 and valleys between the pads 204.

A mask (stencil) 210 is provided. The mask 210 is a thin (e.g., 30 mils thick) planar sheet of relatively stiff material, such as molybdenum, having a plurality of openings (cells) 212, each corresponding to a pad 204 whereupon it is desired to form a solder ball on the substrate 202. A typical cross-dimension for a cell 212 is 40 mils across.

In a first step of forming solder balls on (ball bumping) the substrate 202, the mask 210 is placed on the top surface 202a of the BGA substrate 202 with the cells 212 aligned over the pads 204, more particularly, over the openings 208 in the layer of insulating material 206. As illustrated, due to the size (diameter) of the cells 212, and the irregular surface 206a of the insulating material 206, there will be gaps 214 between the mask 210 and the insulating material 206. A typical dimension for the gap is 1-2 mils. As will be evident, these gaps 214 have benefits and disadvantages.

In a next step of forming solder balls on the substrate 202, the cells 212 in the mask 210 are filled with solder material 220 which is shown as a number of various-size spheres. (The middle cell 212 in the figure is shown without solder material 220, for illustrative clarity.) This is done in any suitable manner such as by smearing solder past on the top surface 210a of the mask 210 and squeegeeing the solder material 220 into the cells 212 of the mask 210.

It is within the scope of the invention that the cells in the mask are filled with solder material prior to placing the mask 210 on the top surface 202a of the BGA substrate 202 with the (filled) cells 212 aligned over the pads 204.

In a next step of ball bumping the substrate 202, a heater stage (platen) 230 is disposed onto the top surface 210a of the mask 210, and the substrate 202, mask 210 and heater stage 230 are held together with clamps (not shown), in the orientation shown in the figure—namely, with the heater stage 230 on top of the mask 210, and with the mask 210 on top of the substrate 202.

It is within the scope of the invention that a pressure (contact) plate (not shown, compare 170) is disposed on the top surface 210a of the mask 210, between the heater stage 230 and the mask 210.

In a next step of forming solder balls on the substrate 202, the heater stage 230 is heated up, typically gradually, to a temperature sufficient to cause the solder material 220 to melt within the cells 212. When the solder material 220 melts, the individual solder particles will merge (flow) together and, due to surface tension, will try to form (and, typically, will form) a sphere.

During reflow heating, small-sized solder particles within the solder material can "leak" out of the gap 214. This is not desirable. On the other hand, the gap 214 allows volatile material to "out gas".

After reflowing the solder material 206, the heater stage 230 is either removed immediately, so that the solder can cool down, or is kept in place and allowed to cool down until the solder has re-solidified as solder balls. As described in greater detail hereinbelow, often, as the solder material cools off, it will try to form a ball which has a larger diameter than the cell. This results in (i) there being an interference fit between the resulting solder ball and the sidewalls of the cell and (ii) a deformed solder ball. Regarding the latter, it is known to reflow the resulting deformed solder balls after removing the mask in order to cause them to assume a more spherical shape.

The forming of solder balls (240) on a substrate (202) is suitably carried out in the orientation illustrated in FIG. 2A—namely, the mask (214) is disposed on top of the substrate (202) and the heater stage (230) is disposed on top of the mask (214).

Alternate embodiments of the invention, where reflow heating is carried out with the mask/substrate assembly inverted, or partially inverted, are described hereinbelow.

An inherent "side-effect" of the described technique 200 is that the flux material in the solder material (106) will liquefy and may run down onto the top surface 202a of the substrate 202 or, in the case of there being an insulating layer 206, onto the top surface 206a of the insulating layer 206. In that the ball-bumped BGA substrate (or ball-bumped semiconductor package assembly) may be "warehoused" for months, prior to being mounted to an interconnection substrate, it is known that it should be cleaned of flux (de-fluxed) soon after the solder balls have been formed on the pads (204). Furthermore, whatever flux was present in the solder material (220) will largely have been dissipated (run-off and cleaned off) in the process the flux ran off (and cleaned) off the solder balls, resulting in that they will need to be re-fluxed prior to assembling to the interconnection substrate. Typically, the flux component of solder material will lose its viscosity and start running at a much lower temperature than the melting point of the solid particulate (solder) component of the solder material.

FIG. 2B illustrates another prior art technique 250 (compare 200) for forming solder balls on a surface of a substrate 252 (compare 202)—more specifically on contact pads 254 (compare 204) of a substrate 252. The substrate 252 has a top surface 252a (compare 202a) and a bottom surface 252b (compare 202b), contact pads 254 (compare 204) disposed on its top surface 252a, and a thin layer of insulating material 256 (compare 206) which has openings 258 (compare 208) aligned with (centered over) the pads 254. The insulating material 256 has a top surface 256a (compare 206a).

A mask 260 (compare 210) has a plurality of cells 262 (compare 212). In this example, the cross-dimension of a cell 262 is smaller than in the previous example (for example only 25 mils across). Due to this smaller cross-dimension, a gap (compare 214) is not formed between the mask 260 and the insulating material 256, and the mask 260 is essentially "sealed" to the substrate 252. This has the advantage that small solder balls and flux material will not "leak out" (through the gap) onto the surface of the substrate 252 (except in the case that the mask is held off of the surface of the substrate by a defect or by contamination). However, the lack of a gap also means that volatiles have no place to escape (vent, "out gas"). Thus, the rate at which the temperature of the solder material 270 is elevated becomes critical. More particularly, if the solder material is heated too fast, the volatiles will try to escape the cell (262) in a "violent" manner, often tending to lift the mask 260 off of the substrate 252. This is not desirable.

As in the previous example, in a first step of forming solder balls on the substrate 252, the mask 260 is placed on the top surface 252a of the BGA substrate 252 with the cells 262 aligned over the pads 254, more particularly, over the openings 258 in the layer of insulating material 256.

As in the previous example, in a next step of forming solder balls on the substrate 252, the cells 262 in the mask 260 are filled with solder material 270 (compare 220) which is shown as a number of various-size spheres. (The middle cell 262 in the figure is shown without solder material 220, for illustrative clarity.)

As in the previous example, it is within the scope of the invention that the cells 262 in the mask 260 are filled with solder material prior to placing the mask 260 on the top surface 252a of the BGA substrate 252 with the (filled) cells 262 aligned over the pads 254.

As in the previous example, in a next step of forming solder balls on the substrate 252, a heater stage (platen) 280 (compare 230) is disposed onto the top surface 260a of the mask 260, and the substrate 252, mask 260 and heater stage 280 are held together with clamps (not shown), in the orientation shown in the figure—namely, with the heater stage 280 on top of the mask 260, and with the mask 260 on top of the substrate 252.

It is within the scope of the invention that a pressure (contact) plate (not shown, compare 170) is disposed on the top surface 260a of the mask 260, between the heater stage 280 and the mask 260.

As in the previous example, in a next step of forming solder balls on the substrate 252, the heater stage 280 is heated up (gradually, as noted hereinabove), to a temperature sufficient to cause the solder material 270 to melt within the cells 262. When the solder material 270 melts, the individual solder particles will merge (flow) together and, due to surface tension, will try to form (and, typically, will form) a sphere.

As in the previous example, after reflowing the solder material 270, the heater stage 280 is either removed immediately, so that the solder can cool down, or is kept in place and allowed to cool down until the solder has re-solidified as solder balls.

As described in greater detail hereinbelow, often, as the solder material cools off, it will try to form a ball which has a larger diameter than the cell. This results in (i) there being an interference fit between the resulting solder ball and the side walls of the cell and (ii) a deformed solder ball. Regarding the latter, it is known to reflow the resulting deformed solder balls after removing the mask in order to cause them to assume a more spherical shape.

As in the previous example, the forming of solder balls on a substrate (252) is typically carried out in the orientation illustrated in FIG. 2B—namely, the mask (260) is disposed on top of the substrate (252) and the heater stage (280) is disposed on top of the mask (260).

Alternate embodiments of the invention, where reflow heating is carried out with the mask/substrate assembly inverted, or partially inverted, are described hereinbelow.

A benefit of the techniques 200 and 250 shown in FIGS. 2A and 2B is that the mask and the solder material contained within the cells of the mask are heated essentially directly, rather than through the substrate as was the case with the technique 100 shown in FIG. 1. Also, as shown in FIG. 2A, a gap 214 allows for out gassing, which permits faster reflow times.

FIG. 3A illustrates a technique 300 (compare 100, 200, 250) for ball bumping a substrate 302 (compare 102, 202, 252)—more specifically on contact pads 304 (compare 104, 204, 254) of a substrate 302. It is within the scope of this invention that the substrate 302 is any electronic substrate, including a semiconductor wafer or a BGA board. The substrate 302 has a top surface 302a (compare 102a, 202a, 252a) and a bottom surface 302b (compare 102b, 202b, 252b). A plurality of contact pads 304 (compare 104, 204, 254) are disposed on the top surface 302a of the substrate 302, and are covered by a thin layer 306 (compare 206, 256) of insulating material, such as a polymer, (or, in the case of the substrate 302 being a semiconductor wafer, a passivation layer) which has openings 308 (compare 108, 208, 258) aligned with (centered over) the pads 304. The insulating material 106 has a top surface 306a (compare 106a, 206a, 256a). The top surface 302a of the substrate 302 has an irregular topology, exhibiting peaks where the insulating material 306 overlaps the pads 304 and valleys between the pads 304.

A mask (stencil) 310 (compare 110, 210, 260), which is suitably a thin planar sheet of relatively stiff material, such as molybdenum, has a plurality of cells 312 (compare 112, 162, 212, 262), each corresponding to and aligned with a pad 304 whereupon it is desired to form a solder ball on the substrate 302. The cells 312 in the mask 310 may be round (circular), as illustrated by the array of cells 312b in FIG. 3B. Preferably, however, the cells are not round (circular). For example, as illustrated by the array of cells 312c in FIG. 3C, the cells 312c may be square. In this manner, for a given spacing, e.g., 10 mils between the peripheries of adjacent cells 312c (in other words the size of the "web" in the mask between adjacent cells 312c), each individual cell 312c can have a larger area, hence a larger volume for a given thickness mask, than a round cell (312b). Alternatively, as illustrated by the array of cells 312d in FIG. 3D, the cells 312d may have a trapezoidal shape, and be arranged in alternating orientations. As in the example of square cells (See FIG. 3C), in this manner, for a given spacing, e.g., 10 mils between the peripheries of adjacent cells 312d (in other words the size of the "web" in the mask between adjacent cells 312d), each individual cell 312d can have a larger area, hence a larger volume for a given thickness mask, than a round cell (312c). All other things being equal, the volume of a trapezoidal cell (312d) can be greater than that of a square cell (312c) which, in turn in greater than that of a round cell (312a). Non-round cells (e.g., 312c and 312d) in a mask (e.g., 310) for forming solder balls on a surface of a substrate is considered to be within the scope of the invention. It should be noted that FIGS. 3B, 3C and 3D are not drawn to the same scale as FIG. 3A.

Returning to FIG. 3A, in a first step of forming solder balls on the substrate 302, the mask 310 is placed on the top surface 302a of the substrate 302 with the cells 312 (preferably the cells 302c or 302d) aligned over the pads 304. Evidently, the irregular surface 306a of the insulating material 306 will result in there being gaps 314 (compare 114) between the mask 310 and the insulating material 306. These gaps 314 can perform a beneficial purpose of allowing volatiles to vent (out gas).

The mask 310 is held in any suitable manner either in direct face-to-face contact with the substrate 302, or ever so slightly spaced therefrom.

Then, the cells 312 are filled with solder material 320. (The middle cell 312 in the figure is shown without solder material 320, for illustrative clarity.)

It is within the scope of the invention that the cells 320 of the mask 310 are filled with solder material either when the mask is in face-to-face contact with the substrate 302, or "off-line" (prior to bringing the mask into face-to-face contact, or near contact, with the substrate.

At this point in the process, the technique of the present invention deviates significantly from the techniques (100, 200, 250) described hereinabove.

FIG. 3E illustrates a next step in the process, wherein the assembly of the mask 310 and the substrate 302, with solder material 320 loaded into the cells 312 of the mask 310 is inverted, so that the substrate 302 is physically atop above the mask 310, as is illustrated in the figure. In this "upside-down" orientation, the solder material 320 will not fall out of the cells 312 in the mask 310, because it is "sticky", being a combination of solid particles and relatively viscous (at room temperature) flux material. The solder material 320 has the general consistency of toothpaste. It should be noted that in this figure (FIG. 3E) the middle cell 312 is shown filled with solder material 320.

Alternatively, it is within the scope of the invention that a pressure (or "contact") plate is placed against the mask, as described with respect to other embodiments of the invention.

As illustrated, this upside-down assembly of the mask 310 and the substrate 302, with solder material 320 loaded into the cells 312 of the mask 310 is brought into contact with a heater stage 330 (compare 130, 230) which is either brought up to or which has been pre-heated to a temperature which is greater than the melting point of the solid particles in the solder material 320.

It is generally preferred that the solder material is gradually rather than abruptly reflowed. For example, by bringing its temperature up to less than its melt point to allow it to "condition" prior to causing it to reflow. It is within the scope of the invention that any suitable heat profile can be used.

For example, "63/37" lead/tin solder has a melting temperature of approximately 183° C. (Centigrade). In which case, the heater stage 330 may be preheated to 140°-150° C. for conditioning the solder material, then brought up to a temperature of at least 215° C., preferably to a temperature which is 20° C.-40° C. higher than the melting temperature of the solid particles of the solder material (i.e., the heater stage 330 is preferably heated to approximately 220° C.-225° C. for reflowing the aforementioned 63/37 solder material).

The upside-down assembly of the mask 310 and the substrate 302, with solder material 320 loaded into the cells 312 of the mask 310 is held in contact with a heater stage 330 for a sufficient period of time "t" for the solid particles in the solder material 320 to melt, and preferably not much longer. Given the dynamics of the overall system, this period of time "t" is preferably determined empirically. However, since the heater stage 330 was already preheated, and since the solder material 320 and the solder mask 310 are both fairly good conductors of heat, and based on experimental trials of the technique of the present invention, it is contemplated that, for most anticipated microelectronic applications of the present invention, a period of time "t" of 5-20 seconds will be sufficient time for the solder material 320 to liquefy. However, in the case of a board (substrate) having heat sinks, for example a thick copper heat sink, the time "t" required to form the solder balls on the substrate may more than 20 seconds, for example 30 seconds.

FIG. 3F illustrates a next step of the process wherein, after the solid particles in the solder material 320 have liquefied, the heater stage 330 is removed from being in further contact with the upside-down assembly of the mask 310 and the substrate 302. This can be done either by lifting the upside-down assembly of the mask 310 and the substrate 302, or by lowering the heater stage 330. The liquefied solder particles of the solder material 320 will begin to cool off and coalesce into one solid mass, typically generally in the form of a sphere.

FIGS. 3G and 3H illustrate the solder balls 340 that are formed by the process of the present invention described hereinabove. In FIG. 3G, the mask 310 is still in place. In FIG. 3H, the mask has been removed, and the ball bumped substrate has been re-flipped over.

While FIG. 3G illustrates an "ideal" situation where the resulting solder balls are perfectly centered within their respective cells, the real world tends not conform so neatly to perfection. As illustrated in the schematic illustration of FIG. 3I, a solder ball 342 which is slightly off-center in a round cell 344 (compare 312b) will exhibit an arcuate area of contact with the side wall of the cell. In contrast thereto, as illustrated in the schematic illustration of FIG. 3J, a solder ball 346 which is slightly off-center in a square cell 348 (compare 312c) will exhibit only minimal (e.g., point) contact with the side wall of the cell. The cumulative effect of a number of solder balls misaligned with the mask openings (cells) and being in contact with the mask can have an adverse undesirable effect on subsequent separation of the mask from the substrate.

A benefit of this "inverted" embodiment of the present invention is that, due to the influence of gravity (i.e., the earth's pull on objects towards the center of the earth), flux material within the solder material 320, which also has been liquefied, will run down the surface of the solid mass, rather than up to the surface of the substrate 302. This is in marked contrast to the previous examples wherein it was observed that the tendency was for the liquefied flux to run down onto the substrate (102, 202, 252). This has some important beneficial results, including:

the substrate (board) 302 does not need to be cleaned;
the resulting solder balls 340 are "pre-fluxed"; and
the resulting solder balls 340 have a clean, oxide-free surface for better (subsequent) soldering.

Another benefit is that the resulting solder balls 340 will have a height (diameter) which is greater than the thickness of the mask 310. Generally, large solder balls 340 having approximately a 1:1 aspect ratio (height:width) are readily formed on pads of substrates using the technique of the present invention. As a result, the molten solder ball can join itself to the substrate without there needing to be any direct contact between the mask and the substrate. Also, the mask can be removed while the solder is still molten, thereby greatly facilitating mask/substrate separation.

FIG. 4 illustrates major components of a "bumping" machine 400 for ball bumping substrates, both in the manner described hereinabove as well as using alternate techniques. The machine 400 comprises a stable platform 402.

The machine 400 comprises a chuck 404 which is disposed on the platform 402, for holding a substrate 406. (The substrate 406 is not a component of the machine 400.)

The machine 400 comprises a mask holder 408 for holding a mask (not shown), and which is mounted in an articulated manner to the platform 402 so that it can be moved from a one position to another position.

The machine 400 comprises a pressure plate holder, such as a simple framework, for holding a pressure plate 410 (compare 120), and which is preferably mounted in an articulated manner to the platform 402 so that it can be moved from a one position to another position. In use, it is preferred that the pressure plate be held in intimate contact with the surface of the mask opposite the substrate during reflow of the solder material in the mask.

A heat source 412 is provided for reflowing solder material in the mask, and which is preferably mounted in an articulated manner to the platform 402 so that it can be moved from a one position to another position. The heat source 412 may be a heater stage, or may be a radiant (e.g., infrared) heat panel, such as may be obtained from Watlow Electric Mfg. Co., St. Louis, Mo., USA.

A print station 414, which may be a flat, non-wettable surface, is optionally provided, for off-wafer filling of the cells of the mask with solder material, as mentioned hereinabove.

One having ordinary skill in the art to which the invention most nearly pertains will understand how to implement the machine 400, for performing the various techniques described herein, in light of the descriptions set forth herein.

Inverted Reflow, Inverted Cooling

FIGS. 4A-4B illustrate a technique 420 for ball bumping substrates. In this technique, the pressure plate is positioned above the heat source, at a location on the machine platform, as illustrated. The mask is positioned on the substrate, which is positioned on the chuck, at another location on the machine platform. With the mask positioned on the substrate, the mask cells may be filled with solder material. Next, the assembly of the chuck/wafer/mask are shuttled into position, upside down, on the pressure plate. The heat source is turned on, and the solder material in the mask melts. Then the heat source is shut off to allow the solder material to cool and coalesce into solder balls. Finally, the mask is separated from the substrate and the substrate is separated from the chuck.

It should be noted that in this, as well as in certain other embodiments described herein, that heat must pass through the pressure plate to melt the solder material within the mask. In the case of using a heat source which is an infrared-type heat source, a quartz pressure plate may be used. Otherwise, the pressure plate may be molybdenum, stainless steel, or the like.

It is within the scope of the invention that the mask cells may be pre-filled with solder material, such as by positioning the mask on a print station surface (414, described hereinabove), or by utilizing the pressure plate as a print station (in which case, the heat source should not be "on").

It is within the scope of the invention that the heat source may have a flat surface so that it can perform the function of the pressure plate, without an additional component.

Inverted Reflow, Un-Inverted Cooling

FIG. 4C illustrates a technique 440 for ball bumping substrates. This technique proceeds in the manner of the technique 420 described hereinabove, up to the point of melting the solder material with the substrate inverted, as illustrated in FIG. 4B. Then, rather than allowing the solder material to cool in this orientation, the assembly of the chuck/wafer/mask are repositioned away from the heat source so that the wafer is "right side up" (un-inverted), and the solder material is allowed to cool. Finally, the mask is separated from the substrate and the substrate is separated from the chuck.

It is within the scope of the invention that the heat source "follows" the assembly of chuck/wafer/mask when it is repositioned, in which case it would be switched "off" to allow the solder material to cool.

Partially-Inverted Reflow and Cooling

As mentioned hereinabove with respect to the technique 300, an advantage of reflowing the solder material in the inverted position, as described by the techniques 420 and 440 is that out gassing may occur in gaps (e.g., 314) between the mask and the substrate, thereby permitting relatively rapid heating (melting) of the solder material. However, it is possible that oxides may become trapped in the interface between the solder material and the substrate pad when reflowing in the inverted orientation.

FIGS. 4D and 4E illustrate an alternate technique 460 for ball bumping substrates. In this technique, rather than inverting the substrate (from 180° to 0°) to reflow the solder material, the substrate is positioned at an angle between 90° (on its side) and 0° (inverted), such as at 45° from inverted, as illustrated. (This also includes orientations for the substrate which are beyond inverted, such as −45°) As illustrated, the substrate has been rotated 135° from being face (pads) up to being partially face down.

As best viewed in FIG. 4E, a mask 462 (compare 310) having openings (cells) 464 (compare 312) extending from a one surface to an opposite surface thereof and filled with solder material 466, has its one surface disposed against a surface of a substrate 468 having pads 470. A pressure plate 472 is disposed in intimate contact against the opposite surface of the mask 462. A middle one of the cells 464 is illustrated without solder material 466, for illustrative clarity, so that the gap 474 (compare 314) can clearly be seen. The assembly of substrate 468, mask 462 and pressure plate 472 are oriented as shown, and it can be seen that the gap 474 is at the highest point of the cell. This facilitates out gassing of volatiles during reflow. The chuck and the heat source are omitted from the view of FIG. 4E, for illustrative clarity.

This technique proceeds in the manner of the techniques 420 and 440 described hereinabove, up to the point of securing the solder-laden mask to the substrate and mounting the pressure plate to the assembly. Then, the assembly is positioned as shown, partially inverted, so that a corner of each cell is the highest point in the cell (see the corner at the gap 474). Reflow is performed in this position, using the heat source (not shown). Finally, the mask is separated from the substrate and the substrate is separated from the chuck.

It is within the scope of the invention that rather than allowing the solder material to cool in the partially-inverted orientation, the assembly of the chuck/wafer/mask are repositioned away from the heat source so that the wafer is "right side up" (un-inverted, 180°), and the solder material is allowed to cool.

It is within the scope of the invention that the heat source "follows" the assembly of chuck/wafer/mask when it is repositioned, in which case it would be switched "off" to allow the solder material to cool.

Compound Mask and Pressure Plate

The benefit of using a pressure plate to capture the solder material in the cells of the mask has been discussed hereinabove. It is generally preferred that the pressure plate be intimately held against the mask so that there are no gaps for leakage, particularly when reflowing inverted or partially inverted.

According to an aspect of the invention, a composite mask performing the functions of a mask and a pressure (contact) plate are formed as an integral unit, thereby assuring no leakage between the two.

FIG. 5A illustrates an embodiment of a composite mask 500, according to the present invention. The composite mask 500 is a rigid planar structure having two portions—a mask portion 510 comparable (e.g.) to the mask 110 described hereinabove, and a pressure plate portion 520 comparable to the pressure plate 120 described hereinabove. A plurality of cells 512 (compare 112) extend from a one surface of the composite mask 500, through the mask portion 510, to the pressure plate portion 520. These "blind hole" type openings 512 are filled with solder material 514 (compare 114) in the manner described hereinabove.

The composite mask 500 is suitably formed of a sheet of metal, such as molybdenum, which is etched to have cells 512 extending into a surface thereof (but not all the way through the sheet). Alternatively, the composite mask 500 can be formed from a sheet of metal comprising the pressure plate portion 520, a surface of which is masked, patterned, and plated up to form the mask portion 510 (with cells 512).

Alternatively, a composite-type mask can be formed from a discrete mask welded or otherwise intimately joined (including adhered) to a discrete pressure plate.

Bridging a Gap

An interesting feature/capability of the present invention is illustrated in FIGS. 5A and 5B, but is not limited to the use of a composite mask. The composite mask 500 is illustrated disposed beneath a substrate which is in an inverted position, for example the substrate 302 from FIG. 3A (see also FIG. 3E). Note that no part of the substrate 302 actually is in contact with the composite mask 500—rather, that there is a small gap 524 between the opposing faces of the substrate and the mask.

As best viewed in FIG. 5B, when the solder material 514 reflows and forms a ball, the ball has a diameter (height) which is greater than the thickness of the mask (in this illustrative case, greater than the thickness of the mask portion 510 of composite mask 500), so it sticks out of the mask, "bridges" the gap 524, and wets itself to the pad 304 on the substrate 302. The solder ball does this while it is in a liquid state, at which point the mask can easily be separated from the substrate, thereafter allowing the solder ball to cool off (solidify).

Stacked Masks

FIG. 5C illustrates a mask stack 550 comprising a first or "Liftoff" mask 552 (compare 110) having a plurality of cells 554 (compare 112) and a second or "volume control" mask 556 having a plurality of cells 558. For example, the mask 552 is 4 mil thick, and the mask 556 is 3 mil thick. The cells 558 are tapered, as illustrated, to provide reduced hole volume control. The orientation of the mask stack 550 as it would be employed for ball bumping a substrate is illustrated by the substrate 560 having pads 562 and a pressure plate 564.

The mask stack 500 is beneficial in applications where particularly tall (high aspect ratio) solder balls (columns) are desired to be formed on a substrate, tending to overcome inherent limitations in the aspect ratio of holes that can be formed in masks. The two (or more) masks may be removed one at a time after solder ball formation to reduce liftoff stress.

There have thus been described, with respect to FIGS. 5A, 5B and 5C a number of mask "variations", including a composite mask, a mask which is spaced from the substrate being bumped, and a mask stack. Other mask variations may occur to one having ordinary skill in the art to which the present invention most nearly pertains, in light of the teachings set forth herein.

High Aspect Ratio Ball Bumps

Solder balls which are generally spherical, will, by definition, exhibit substantially a 1:1 aspect (height:width) ratio. If they are hemispherical, the solder balls will have an aspect ratio of approximately 0.5:1. The generally spherical shape assumed by solder balls formed as described hereinabove is based on the physics of surface tension, and inherently prevents the formation of "tall" (high aspect ratio) ball bumps by ordinary means. This is a limiting characteristic because, in certain applications, tall (high aspect ratio) solder bumps can be used to great advantage in reflow assembly (e.g., of a packaged semiconductor device to a printed circuit board). As mentioned above, in general it is difficult to form contacts with aspect ratios of greater than 1:1. Some prior art techniques involving "building up" of solder contact height in a series of process steps have managed to produce tall (high aspect ratio) contacts, but such techniques are typically expensive and cumbersome in high-volume production.

FIG. 1A (described above, see also FIGS. 1D and 1E, below) shows substantially spherical aspect ratio solder balls 130 disposed on pads 104 on a substrate 102. Each solder ball 130 has a height H which is substantially equal to its diameter D. This is illustrative of a "1:1" aspect ratio.

FIGS. 6A-6D illustrate a process for forming high aspect ratio (tall) solder bumps, according to the invention. The process benefits from any of the techniques for forming solder balls and bumps disclosed herein.

FIG. 6A is comparable to FIG. 1A, above, and shows a substrate 602 after the step of ball bumping ("bump"). Herein it can be observed that the solder balls 630 (compare 130) are generally spherical, have a diameter "D1" (compare D, FIG. 1A) and have a height "H1" (compare H, FIG. 1A). The solder balls 630 are shown as having been formed on pads 604 (compare 104) on the substrate 602 (compare 102).

For example, on a semiconductor wafer, the solder balls 630 have a diameter D1 of 5 mils and a height H1 of 4 mils, the pads 604 have a size of 4 mils×4 mils, the solder balls are substantially spherical, and the pads (hence, the solder balls) are disposed at a pitch of 8 mils.

FIG. 6B illustrates a next step ("encapsulate"). Here, the bumped substrate is encapsulated, or over molded, with a non-conductive material 640 such as plastic, polyimide, or silicone. This can be done using spinners, or potting, or dispensing. The thickness H2 of the material 640 preferably greater than the height H1 of the solder balls (H2>H1). For example, the thickness H2=8 mils. The top surface of the material 640 may be wavy, as illustrated.

FIG. 6C illustrates a next step ("lap"). Here, the over molded substrate is lapped (polished, ground) to reduce the thickness of the material 640, also to planarize the surface of the material 640, and to expose the solder balls 630. Lapping should preferably proceed until the thickness H3 of the over molding material 640 is less than the height H1 of the solder balls 630. (H3<H1). This means, of course, that the solder balls will also be lapped, resulting in their having flat top surfaces 630a exposed. For example, the thickness H3=3.5 mils. Generally, the dimension H3 is preferably 60-90% of the dimension H1, such as 70-80%, 75-90%.

It is within the scope of the invention that a selective (e.g., chemical) etching process can be used, either during step 2 or after step 2, so that tops of the solder balls are either (i) recessed slightly below or (ii) extend slightly above the resulting top surface of the over molding material. For example, the top surfaces 630a of the solder balls 630 may be recessed 0.2 mils below the surface 640a of the over molding material. Or, for example, the top surfaces 630a of the solder balls 630 may extend 0.2 mils above the surface 640a of the over molding material. Or, as shown, the top surfaces 630 of the solder balls can be coplanar with the top surface of the over molding material 640.

It is within the scope of the invention that an alternative to overmolding and lapping and would be, after step 1 to press the balls 630 against a soft rubber (or the like) substantially planar surface (not shown) that would protect the top surface of the balls 630 and act as the top mold plate to limit plastic flow when molded. (The top portions of the balls 630 would embed themselves in the rubber surface.) In this case, the material 140 would simply have a thickness less than H1, and the top portions of the balls would extend out of the material 140, thereby alleviating the need for lapping (step 3) to expose the top surfaces of the balls.

The first three steps (bump, over mold, lap; or rubber surface alternative) result in an interim product which is an encapsulated electronic component suitable for mounting directly to a PC board. It is within the scope of the invention that the interim product may be further processed, as follows.

FIG. 6D illustrates a next step ("bump, again"). Here, a second set of solder balls 650 are formed atop the bumped/over molded/lapped substrate. Each second solder ball 650 is formed atop a corresponding one of the over molded/lapped solder balls 630. It is desirable when forming the second bump (ball) 650 not to remove or to wick out the first bump (ball) 630, and create a large dual volume bump on the surface. Limiting the opening at lapping is one method. Using the captured cell technology described herein is an effective method to restrict surface tension forces.

The resulting ball bumped substrate is a final product and can be used with standard printed circuit materials and methods. The additional bump height improves resistance to thermal and mechanical stresses. The molding material offers ionic protection to the delicate semiconductor circuit, and the corrosive materials used during soldering.

The resulting solder ball structure of one ball 650 atop another 630 has a high aspect ratio. Rather than calling it a "ball" or a "bump", it may be termed a "reflowable interconnect structure".

It is within the scope of the invention that the final product shown in FIG. 6D can further be processed by further over molding and lapping, in the manner described with respect to FIGS. 6B and 6C, resulting in even greater height for use with even smaller ball diameters and pitch.

It is within the scope of the invention:
- after the step 3 (lapping), selective etching the solder balls or the plastic encapsulating material (discussed above).
- after the step 3 (lapping), metallize the top surface, including fanning out.
- after the step 3, metallize the top surface, mount de-coupling capacitors.
- in lieu of steps 2 and 3, embedding the top portions of the balls in a resilient mold surface (discussed above).
- chip scale packaging (CSP).
- after the step 3 (lapping), mounting a flex circuit to the top surface.
- after the step 4 (bump again), repeating the steps 2, 3 and 4, resulting in yet greater interconnect height.

High Volume Solder Bumps

High aspect ratio solder bumps are discussed immediately hereinabove. Generally speaking, the greater the volume of solder material in the solder bump, the better. This is believed to be because solder will eventually initiate (start) a crack at or near the interface of the bond pad to the solder bump, when subjected to thermal cycles. This crack will propagate a given distance per thermal cycle after it initiates. Usually as the crack propagates far enough a second crack initiates opposite the first, and this continues across the diameter of the bump. The number of temperature cycles to crack initiation, and the rate at witch the cracks propagate are mostly dependent on the maximum stress present. High (tall, high aspect ratio) bumps or greater distances between substrates decreases the maximum stress present at thermal cycles and therefore increases the durability of products by increasing the number of cycles it takes to initiate cracks, and it slows down the propagation rate—resulting in increased useful life.

FIGS. 1C-1E (compare FIG. 1A) show substantially spherical solder balls 130 disposed on pads 104 on a substrate 102. The pads 104 are typically square (as shown), or octagonal (stop sign shaped). Each solder ball 130 has a height H which is substantially equal to its diameter D. Since the solder balls are spherical, they have substantially a 1:1 aspect ratio. Since the solder balls are spherical, they have a volume of substantially $\frac{4}{3}*pi*(d/2)^3$.

As discussed above, the mask (e.g., 110) has a plurality of openings/cells (e.g., 112, 312c), each corresponding to a pad 104 whereupon it is desired to form a solder ball 130 on the substrate 102. The mask openings are typically substantially the same size and shape as the bond pads 104.

FIGS. 7A-7C illustrates an embodiment of high volume, aspherical solder bumps 730 (compare 130) disposed on pads 704 (compare 104) on a substrate 702 (compare 102). The term "bumps" is used in describing this embodiment, rather than "balls", because the bumps are not substantially spherical. The bond pads 704 are asymmetrical, in this example simply rectangular, having a long dimension b1 and a short dimension h1. Aligning the long dimension b1 perpendicular to the stress produced in assemblies can improve the use full life dramatically by reducing maximum stress present by;

1. Increasing bump height
2. Dissipating stress over a greater area
3. Dissipating stress by having one portion of the bump always under strain (force is applied at center and outer solder material pushed while inner material ripped, then reversed as temperature cycle is reversed as compared to a tower of material bent back and forth to failure.
4. Life also improved further by greatly increased crack propagation distance as it progresses down the long axis of the bump.

High volume solder bumps 730 are formed using the techniques described herein (for example, with respect to FIGS. 3A, 3F, 3G, 3H). In this case, the mask (e.g., 110) would have a plurality of openings/cells (e.g., 112, 312c), each corresponding to a pad 704 whereupon it is desired to form a solder bump 730 on the substrate 702. The mask openings are typically substantially the same size and shape as the bond pads 704—in this example, rectangular.

In this case, the resulting solder bump 730 is not substantially spherical. It has a height H' (which may be comparable to or greater than the height H of the solder bumps 130), a dimension b2 along a major axis aligned with the long dimension b1 of the pad 704, and a dimension h2 along a minor axis aligned with the short dimension h1 of the pad 704.

It should be noted that, although the aspect ratio for the solder bumps 730 is lower than 1:1, they nevertheless benefit from having increased mass (volume), which (roughly speaking) translates into increased reliability.

FIGS. 7D-7F illustrate an alternate embodiment of high volume, aspherical solder bumps 760 (compare 730) disposed on pads 734 (compare 704) on a substrate 732 (compare 702). The term "bumps" is used in describing this embodiment, rather than "balls", because the bumps are not substantially spherical.

In this embodiment, rather than having one asymmetrical pad (704) per solder bump (730), each solder bump 760 is formed a pair of bond pads 734a and 734b (compare 704) which are spaced apart from one another. There is a gap 736 (see FIG. 7D) between the two bond pads 734a and 734b. The two pads 734a and 734b, in aggregate, form an "aggregate" asymmetrical bond pad 734 which, in this example is simply rectangular, suitably (but not necessarily) having the same long dimension b1 and short dimension h1 as the single asymmetrical pad 704. In other words, a given pair of pads 734a/b suitably has the same overall profile (outline) as a given pad 704. For example, each bond pad 734a (or 734b) is 2 mils×2 mils, and the gap between the two bond pads is 1 mil. Therefore, the resulting "aggregate bond pad" 734 is 5 mils×2 mils (b1×h1).

High volume solder bumps 730 are formed using the techniques described herein (for example, with respect to FIGS. 3A, 3F, 3G, 3H). In this case, the mask (e.g., 110) would have a plurality of openings/cells (e.g., 112, 312c), each corresponding to a pair of bond pads (an "aggregate" bond pad) 734 whereupon it is desired to form a solder bump 760 on the substrate 732. To this end, the mask openings are typically substantially the same size and shape as the pair of bond pads 734—in this example, rectangular.

In this case, the resulting solder bump 760 is not substantially spherical. It has a height H' (which may be comparable to or greater than the height H of the solder bumps 130), a long dimension b2 along a major axis aligned with the long dimension b1 of the aggregate pad 734, and a short dimension h2 along a minor axis aligned with the short dimension h1 of the aggregate bond pad 734.

In this example, the long dimension b2 is approximately 5/2 (250%) the short dimension h2. It is within the scope of the invention that the dimension b2 is from 1 to 5 times greater than the dimension h2, including from 1.5 to 3 times greater, including from 1.5 to 5 times greater, 2 to 4 times greater, 2-5 times greater, and that it may be greater than 5 times greater.

The solder bump 760 is substantially similar to the solder bump 730, with the exception that since it is formed on a pair of two spaced-apart pads 734, it has a void space (notch, gap, recess, void) 762 (see FIG. 7F) on its bottom surface, essentially in the middle of bottom surface of the solder bump 760 and extending transversely (minor axis) across the bottom surface of the solder bump 760. This forms a bridge-like structure (a structure supported at both ends, and not in the middle) which permits the solder bump 760 to accommodate stresses and strains, particularly in the longitudinal (major axis) direction, better than comparable spherical solder balls (e.g., 730). This also interrupts the initiated crack that would normally propagate to failure, this crack interruption offers improved reliability and fault tolerant assemblies to be produced.

The aspect ratio for the solder bumps 760 is approximately 1:1 in one axis, and substantially is lower than 1:1 in the other axis. Although lower along the major axis, the solder bumps benefit from having increased mass (volume), which (roughly speaking) translates into increased reliability.

FIGS. 7G-7I illustrate an alternate embodiment of solder balls 790 (compare 760) disposed on pads 764 (compare 734) on a substrate 762 (compare 732). The term "balls" is used in describing this embodiment, rather than "bumps", because the bumps are substantially spherical.

In this embodiment, rather than having one asymmetrical pad (704) per solder bump (730), or two spaced-apart pads (734a and 734b), the bond pad 764 is symmetrical and is formed as a ring having a diameter and a hole 766 in the middle. The bond pad 764 has an outer diameter b3 and an inner diameter b4. For example, the outer diameter b3 is 5 mils, and the inner diameter b4 is 2.5 mils.

Solder balls 760 are formed using the techniques described herein (for example, with respect to FIGS. 3A, 3F, 3G, 3H). In this case, the mask (e.g., 110) would have a plurality of openings/cells (e.g., 112, 312c), each corresponding to a bond pad 764. whereupon it is desired to form a solder bump 790 on the substrate 762. To this end, the mask openings are typically substantially the same size and shape as the bond pads 764—in this example, round (see, e.g., FIG. 3B), although rectangular (or square) openings can contain more solder paste for a given cross-dimension.

In this case, the resulting solder ball 790 is substantially spherical. It has a height H" (which may be comparable to or greater than the height H of the solder bumps 130), and a diameter b5. In this example, the diameter b5 is substantially equal to the height H", resulting in an aspect ratio of substantially 1:1.

The solder bump 790 is substantially similar to the solder bump 730 (or 130), with the exception that since it is formed on a ring-shaped pad 764, it has a void space (notch, gap, recess, void) 792 (see FIG. 7I) on its bottom surface, essentially in the center of bottom surface of the solder ball 790, on the bottom surface of the solder ball. This gap 792 serves the same purpose as the gap 762—namely, accommodating stresses and strains, but in this case symmetrically in both axes.

It is within the scope of the invention that the gap 736 or the hole 766 is filled with a dollop of material such as plastic, polyimide, or silicone to prevent formation of a solder bump 760 or solder ball 790 within the gap.

Assembling the Mask to the Substrate

FIG. 8A illustrates an alternate embodiment of a an "assembly" 800 of a mask 802 (compare 110) and a substrate 804 (compare 102. The substrate 804 is supported by a workholder (stage, chuck) 806, which is on the machine platform 810. pedestals 812 and 814 extend upward (towards the mask) from the workholder 806. The mask 802 is shown having a mask mount 816 fixing a one edge thereof. When the mask 802 is brought down onto the substrate 804, a vacuum is drawn through the vacuum pedestals 812 and 814 to hold the mask 802 intimately against the substrate 804.

FIG. 8B illustrates how a pressure plate 820 (compare 410) may be added to the "assembly" (800) of mask 802 and substrate 804. The assembly 800 is inverted and disposed onto the pressure plate 820. The pressure plate may simply be a stainless steel plate which is held by pedestals 822 extending upwards (towards the pressure plate) from the machine platform 810. A heater stage 824 (compare 412) is disposed underneath the pressure plate. If desired, the pressure plate 820 may be secured to the assembly 800, in intimate contact with the mask 802 using magnets, vacuum chucks and the like.

It is within the scope of the invention that any combination of gizmos, gadgets, and the like (cam surfaces, vacuum chucks, magnets, electromagnets) can advantageously be utilized to hold the mask to the substrate and to hold the pressure plate to the mask.

Preferably, as shown and described with respect to FIG. 10, a set of lift magnets (1028) hold the mask (via carrier 1020) to the chuck base (1014). Generally, magnets are preferred over vacuum.

Preferably, as shown and described with respect to FIG. 10D, the mask (1010) is glued in a stainless steel (SS) mesh (1013) in a frame (1012).

Biased Chuck

As mentioned above, a mask is placed substantially into face-to-face contact with a substrate being bumped. When the assembly of the mask and the substrate are moved (re-positioned), such as to an inverted or semi-inverted position, the mask may separate somewhat from the substrate, allowing solder material to enter gaps between the mask and the substrate. Also, during reflow, the mask may warp or buckle, also allowing solder material to enter gaps between the mask and the substrate. According to an aspect of the invention, a biased chuck assembly is provided for maintaining an intimate face-to-face contact between a mask and a substrate being bumped.

FIG. 9 illustrates a biased chuck assembly 900 for holding a substrate 902 such as, but not limited to, a semiconductor wafer in positive contact with a mask 904. In a manner such as described hereinabove, two opposite edges of the mask 904 may be retained by rails 906 and 908, so that the mask 904 can be tensioned (stretched). See FIG. 10D for a more preferred technique for tensioning the mask.

Semiconductor wafers are relatively brittle, but are known to have a certain degree of flexibility. For purposes of practicing this invention, the degree of flexibility possessed by a semiconductor wafer is sufficient to allow the semiconductor wafer 902 to deflect when urged against the mask 904 so as to maintain substantially intimate contact between the surface of the mask 904 and the surface of the semiconductor wafer (substrate) 902.

The substrate 902 is urged against the mask 904 in the following manner. A rigid, generally planar chuck base 910 has a central recess (cavity) 912 extending into the chuck base 910 from a top (as viewed) surface thereof. The recess 912 is sized and shaped to receive a generally planar, flexible diaphragm 914. The diaphragm 914 extends across the recess 912, and is secured to the chuck base 910 such as with a bead 916 of a suitable adhesive 916 disposed about the periphery of the diaphragm 914. An inlet tube 920 extends from exterior the chuck base 910 to within the cavity 912, underneath the diaphragm 914. In this manner, when a gas such as nitrogen is introduced at a positive pressure into the inlet tube 920, the diaphragm 914 is caused to deflect upwards (as viewed), urging anything disposed atop the diaphragm 914 (in this case, the wafer 902) upwards (in this case, against the mask 904). The diaphragm 914 is suitably a 0.125 inch thick sheet of silicon rubber material. The peripheral edge of the diaphragm 914 is preferably "contained" by the side wall of the cavity 912, as illustrated.

Preferably, a permeable substrate 928, such as a 100 mil thick powdered metal plate, is disposed beneath the diaphragm 914, between the diaphragm 914 and the bottom surface of the cavity 912. When a suction is applied to the inlet tube 920, the permeable substrate 928 will prevent the diaphragm 914 from closing off the opening.

A second central recess (cavity) 922, coaxial with and larger (wider, of greater diameter) than the recess 912 extends into the chuck base 910 from the top surface thereof, and is sized and shaped to receive a generally planar, flexible manifold element 930.

As best viewed in FIG. 9A, the manifold element 930 has a top surface 932 and a bottom surface 934. A plurality of grooves 936 extend, such as crisscross style (2 parallel sets of intersecting grooves), across the top (as viewed) surface of the manifold element 930. An opening 938 extends from the top surface 932 of the manifold element 930 (or from a bottom of one of the grooves 936) through to the bottom surface 934 of the manifold element 930. The opening 938 is aligned with an inlet orifice 940 in the chuck base 910.

As best viewed in FIG. 9, the manifold element 930 extends across the recess 922, and may be secured to the top (as viewed) surface of the diaphragm 914. (Alternatively, the manifold element 930 may be formed integrally with the diaphragm.) In this manner, when a vacuum is pulled on the inlet tube 940, a substrate 902 sitting atop the manifold element 930 is held in intimate contact with the manifold element 930. The manifold element 930 is suitably a 5 mil thick sheet of a film material such as Kapton™.

In use, a wafer 902 is loaded onto the chuck assembly 900. The wafer 902 is disposed atop the manifold element 930. The mask 904, which may previously have had solder material introduced into its cells (apertures), is disposed against (including nearly against) the surface of the wafer. A positive pressure is introduced into the inlet tube 920, and the assembly of mask and wafer can be manipulated (e.g., inverted, partially-inverted) for reflowing the solder material, as discussed hereinabove. Intimate contact is assured between the mask and the substrate by the positive pressure at the inlet tube 920. After the solder material has been reflowed, preferably after the solder balls have formed on the substrate, a negative pressure (vacuum) is applied to both of the inlet tubes 920 and 940 to hold the wafer 902 firmly to the chuck assembly 900 so that the mask 904 may be lifted off of (released from) the wafer 902.

An additional advantage of the chuck assembly 900 is that the wafer 902 is disposed upon a non-metallic film 930 which, in turn, is disposed upon a non-metallic membrane 914, both of which (930 and 914) serve as thermal barriers to isolate the thermal mass of the chuck base 910 from the wafer 902. Inasmuch as it is generally preferred to keep the thermal mass "seen" by the heater element to a minimum so that the solder material in the mask may efficiently be reflowed, this serves to reduce the effective thermal mass of the chuck assembly. This also evens the load across great areas, without the normal high and low pressures seen using rigid chucks.

Examples of Solder Materials and Mask Dimensions

A suitable solder material for use with the present invention comprises "63/37" lead/tin solder having a melting temperature of approximately 183° C. (Centigrade), and has relatively large particle sizes. Large solder particles are less likely to leak out of any gap (e.g., 314) between the mask and the substrate being bumped. The following chart lists a number of exemplary dimensions and relationships between:

D, the diameter of the desired resulting solder ball;
W, the cross-dimension of the cell in the mask;
T, the thickness of the mask;
d, the particle size (e.g., diameter);
, the approximate number of particles in a cell; and
%, the final percentage of metal, by volume, in the cell.

| D (mils) | W (mils) | T (mils) | d (mils) | # | % |
|---|---|---|---|---|---|
| 4 | 6 | 3 | 1.5 | 18 | 31 |
| 5 | 7-8 | 4 | 2 | 15 | 28 |
| 10 | 12-13 | 8 | 4 | 37 | 42 |
| 20 | 25 | 15 | 5 | 63 | 44 |

Notes:
1. The pitch of the pads on the substrate being bumped is typically twice the diameter (D) of the resulting solder ball.
2. The size of a pad on the substrate being bumped is typically approximately equal to the diameter (D) of the resulting solder ball.
3. The final percentage (%) metal is determined without compression of solder material in the cell.

From the chart presented above, it is evident that:

The cross-dimension (W) of a mask cell is always greater than the thickness (T) of the mask.

The solder material filling the cells in the mask preferably comprises solder particles which of a size (d) which is relatively "huge" in comparison to the cell cross dimension (W) or diameter (D) of the resulting solder ball. As is evident from the chart presented above, the dimension "d" is at least approximately 20% of the dimension "W". And, the dimension "d" is at least approximately 25% of the diameter "D" of the resulting solder ball.

According to the invention, the solder material comprises solder particles of a size (d) which is at least 10% of either the cross-dimension (W) of the mask cell or the diameter (D) of the resulting solder ball, including at least 20% of the cross-dimension (W) of the mask cell or which is at least 25% of the diameter (D) of the resulting solder ball. As compared to mask thickness (T), the smallest particle diameter (d) should be at least 40% of the mask thickness, including at least 50%.

An advantage of using "huge" solder particles in the solder material is that the particles will be less likely to "leak out" of any gap (e.g., 314) between the mask and the substrate. A typical dimension for a gap between a mask and a substrate being ball-bumped, due to non-planarity's in the substrate, may be on the order of 1-2 mils.

Another advantage of using "huge" solder particles is volume control, and increasing the percentage of solid material in each cell of the mask, so as to maximize resulting solder ball size. Using a typical solder paste, which is a homogeneous suspension of metal powder in a flux vehicle, the percent solid material is limited by the solder paste composition. In contrast thereto, huge particles, when forced into the cell, will displace flux, and may also compact (deform). In this manner, a surprisingly large volume percentage can be achieved.

It should also be understood that the solder particles in the solder material used to fill the cells in the masks of the present invention are not necessarily spherical, in which case they would have a width or cross-dimension rather than a "diameter".

In the context of there being gaps between a mask carrying the solder material and a surface of the substrate being ball-bumped, the solid particles preferably exhibit a minimum diameter which is larger than the largest gap between the mask and the substrate.

A suitable solder material contains particles of lead/tin solder, in a matrix of flux, with the following proportions: 80% (by weight) solid material (e.g., particles of lead/tin solder), and 20% (by weight) flux (including volatiles). In terms of relative volume percentages, the same typical solder material may contain approximately 55% (by volume) of solid material (metal) and 45% (by volume) of flux.

According to the invention, a suitable solder material for use in being applied to a substrate and reflowed to form solder balls on the substrate has the following composition and characteristics:

a plurality of solid particles of solder material suspended in a flux-material;
the solid particles having diameters in the range of from approximately 1.5 mils to approximately 5.0 mils.

Preferably, the average size of the solder particles is such that they number (#) in the range of a few dozen to a few hundred solder particles filling each cell of the mask.

Novelty and Non-Obviousness

The present invention includes many features which are not taught or suggested by the prior art, including but not limited to the one or more of the following features taken either alone or in combination with one another:

captured cell;
biased chuck;
square mask openings;
off-line (away from the wafer) filling of the mask;
the use of huge solder particles, and compaction;
ensuring a gap (non-contact ball bumping) between the mask and the substrate; heating via the mask rather than through the substrate;
reflowing partially inverted; and
un-inverting before cooling.

For example, the inverted reflow feature of the present invention is distinguishable over that which was described in the IBM-2 patent. The IBM-2 patent fails to use a captured cell. It is believed that the IBM-2 process, lacking the captured cell feature of the present invention, would result in molten solder leaking out of the fixture.

For example, the use of such "huge" solder particles is a non-obvious deviation from the use of solder pastes as indicated by the aforementioned Hewlett Packard, IBM-1 and IBM-2 patents.

As mentioned in the Hewlett Packard patent, solder paste is a homogeneous, stable suspension of metal powder in a flux vehicle. The largest allowed particle diameter should be below 40% of the mask thickness. As mentioned above, according to the present invention, the smallest particle diameter (d) should be at least 40% of the mask thickness, including at least 50%.

For example, the present invention is in marked contrast to any prior art that significantly heats the substrate being bumped, or that heats through the substrate being bumped. The substrate provides an unreliable conductive path for heat, and imposing thermal stresses upon the substrate is generally undesirable. It is thus preferred, as disclosed herein, to direct heat at the mask so reflow the solder material in the cells of the mask.

Another advantage of the present invention is, as described hereinabove, since the solder ball has a diameter which exceeds the thickness of the mask and sticks out when reflowed, it can join itself to the substrate without there having been any contact between the mask and the substrate. Also, the mask can be removed while the solder is still molten, thereby greatly facilitating mask/substrate separation.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

For example, the heater stage could be left in place while the solder balls cooled off and solidified (i.e., rather than separating the heater stage from the assembly of the mask and the substrate), in which case the resulting solder balls would have flat tops. However, in light of the desire to re-utilize the preheated heater stage as quickly as possible, without needing to bring it back up to temperature, such a scheme is generally not preferred.

For example, although the invention has been described mainly in terms of the mask being in face-to-face contact with the substrate being bumped, it is within the scope of the invention that a small (e.g., 0.25-0.75 mil) spacing is maintained between the mask and the surface of the substrate to prevent any damage to a delicate substrate surface that may result from contact with the mask. Since the method of the present invention handles gaps resulting from substrate surface topology, it is evident that maintaining an overall gap between the mask and the substrate is feasible.

For example, although a solder material comprising solder particles and flux is described, the solder material may be dry, such as fluorine-treated, or using a forming or reducing gas.

For example, any suitable heating profile may be used to reflow the solder material, such as in accordance with the manufacturer's specifications.

For example, the mask may be coated with a polymer such as photo-imagable polyimide or silicone rubber. This will protect the substrate against damage if the mask is in contact with the substrate. The coating, if sufficiently thick, can also serve as a conformal mask mating to irregular surfaces, and improve the volume of solder per cell, and help release the substrate.

For example, after ball-bumping one substrate (or a plurality of substrates in a workholder, in preparation for the ball-bumping the next substrate (or the next batch of substrates) the mask is preferably cooled, for example by blowing nitrogen gas over it, to get it below the activation temperature of the flux (which is lower than the melting point for the solder). For example, to cool the mask off to approximately 50° C., or lower.

Many of the features discussed hereinabove can be "mixed and matched" with one another. Other features are generally incompatible with one another—for example, it might be inapposite to have a biased chuck as in FIG. 9 along with a bridging the gap embodiment as in FIG. 5A. One having ordinary skill in the art to which the invention most nearly pertains will understand which features work well with one another and which do not.

In the main hereinafter, substrates which are semiconductor wafers ("wafers") are discussed, but the invention is not limited to wafer substrates.

Captured Cell

One of the distinguishing, and rather critical features of the invention over many of the prior art approaches is that the present invention uses "captured cell" technology. As described above, the cells can be closed by a pressure plate (e.g., 120, 170, 410, 472, 564, 820) by the heater stage itself (e.g., 230, 280, 330) or by using a mask (e.g., 500) with blind holes (512).

In the embodiments described hereinbelow, the cells of the mask are typically closed off by the heater stage itself, without a separate pressure plate.

Characteristic of the Mask

The mask should have low thermal expansion, with holes which are etched rather than drilled. This is applicable to masks that have cells which are either through holes, or which are blind holes.

Mounting the Mask

It was previously believed that permitting the mask to expand freely, in one axis, would be the best way to alleviate problems associated with warpage (warping), and this is suggested in FIG. 8A (mask 802 mounted at one edge by 816).

A more preferred system for mounting the mask has been developed. The mask is, for example, a molybdenum sheet with holes. The mask is preferably mounted to a stainless steel (SS) mesh (screen) which is pre-tensioned on a disposable frame. The mask and SS mesh are glued together. Then the SS mesh is cut away from the center of the mask (this applies tension to the mask), where the holes (cells) are. One edge of the mask is directly attached. The opposite edge has approximately one inch (2.54 cm) of SS mesh between the mask and the frame. This allows the mask to expand, and the SS mesh takes up the slack. This also allows the frame to change temperature without affecting mask tension. If all four sides of the mask were directly mounted to the frame, as the frame cooled, the mask could buckle (or "oil can"). See FIG. 10D, described below.

Reducing Forces

In the embodiments described hereinbelow, printing (filling the mask cells) is mainly done "off-line", without the mask first being on the wafer. This is important in that it reduces the force required on the wafer from print blade forces, and reduces cell volume variations, as described in greater detail hereinbelow.

Capturing the Cells

The cells are closed by the heater stage itself. Magnets are disposed about the periphery of (located outside of) the mask frame and the heater stage to hold the heater stage to the mask frame. Also, after filling the cells with solder paste, the opposite side of the mask is closed by the wafer (as an example of a substrate being ball bumped). Magnets are disposed about the periphery of (located outside of) the chuck assembly to hold the chuck assembly to the mask frame. The mask frame slides into the carriage with land areas for magnets to contact. The carriage moves the mask and frame assembly to the chuck, etc. In this manner the force required on the wafer to maintain the captured cell can substantially be reduced, which has been found to be beneficial.

An Exemplary Machine and Process Flow

FIG. 10 illustrates an exemplary ball bumping machine 1000 having a base 1002, a chuck 1004 on the left side for holding a wafer 1006 and a heater stage 1008 on the right side. A mask 1010 is held in a frame 1012. The chuck 1004 is disposed in chuck base 1014. The heater stage 1008 is disposed in a heater stage base 1016.

An elongate shuttle (carriage) mechanism 1018 is pivotally attached to the base 1002 at a point "P" between the chuck 1004 and the heater stage 1008. The frame 1012 is held in a carrier 1020 which is attached to the opposite (free) end of the shuttle mechanism 1018. A motor 1021 controls the position of the shuttle mechanism 1018. The shuttle mechanism 1018 can shuttle the mask 1010 (i.e., the carrier 1020) between the heater stage 1008 on the right side (as shown) and the chuck 1004 on the left side. The shuttle mechanism 1016 pivots about the point "P". Cameras (not shown) are used to make alignments, for example of the mask 1010 to the wafer 1006.

A set of holddown magnets 1022, which preferably are electromagnets, selectively hold the chuck base 1014 to the machine base 1002. Similarly, a set of holddown magnets 1024, which preferably are electromagnets, selectively hold the heater stage base 1016 to the machine base 1002. The carrier 1020 is ferrous, or has ferrous "lands". A set of lift magnets 1026, which preferably are electromagnets, selectively hold the carrier 1020 to the heater stage base 1016. Similarly, a set of lift magnets 1028, which preferably are electromagnets, selectively hold the carrier 1020 to the chuck base 1014.

In this manner, the mask can be brought down onto the heater stage, the magnets 1026 turned on, the magnets 1024 turned off, and the heater stage can be lifted by the shuttle mechanism 1016. In other words, when the mask is shuttled, it can take the heater stage with it. Similarly, the mask can be brought down onto the chuck, the magnets 1028 turned on, the magnets 1022 turned off, and the chuck can be lifted by the shuttle mechanism 1016.

A more detailed example of mask mounting is shown in FIG. 10D where one can see the mask 1010 glued (mounted with an adhesive 1011) to a SS mesh 1013 in a frame 1012, as described hereinabove, and an area 1032 of cells 1034, as described hereinbelow.

FIG. 10B illustrates an embodiment of a chuck assembly, according to the present invention in somewhat more detail than it was illustrated in FIG. 10. This is similar to the chuck of FIG. 9, but without some elements and with the addition of other elements. But the basic idea is the same—namely, to hold the wafer and be able to introduce pressure to flex it into intimate contact with (in this example) the printed mask.

What was shown as chuck assembly 1014 in FIG. 10 can be seen to comprise an inner chuck base 1054 and an outer chuck base 1056. The outer chuck base 1056 sits atop the machine base 1002. The lift magnets 1058 (compare 1028) are located in the outer chuck base 1056. A wafer 1006 is shown disposed above everything, merely for illustrative perspective.

The inner chuck base 1054 is mounted on a set of legs 1062 within the outer chuck base 1056, and the legs allow the inner chuck 1054, hence the wafer 1006, to be raised or lowered by a stepper motor or other suitable actuator (not shown), as discussed above. An air cylinder 1064 provides pressure for flexing the wafer, as described hereinabove.

A vacuum line 1066 extends through various (three shown) insulating layers 1068 (three shown) to a manifold element 1070, for holding the wafer. The manifold element is suitably mica ceramic.

FIGS. 11A-11D illustrate an exemplary process flow, as described hereinafter. Various alignment steps are omitted from the description, as they will be well understood by the person of ordinary skill in the art to which the invention most nearly pertains.

In a first process step (FIG. 11A), the mask 1010 is disposed on the heater stage 1008, and is secured (assembled) to the heater stage by turning on the lift magnets 1026. This is before the cells of the mask are filled with solder paste, and before the heater stage is heated up.

As best viewed in FIG. 10A, the mask 1010 has an area 1032 (typically centrally located on the mask) that has cells 1034 extending completely there through. A groove 1030 is formed in the top surface of the heater stage, and preferably extends entirely around an area corresponding to the area 1032 of cells 1034. The groove 1030 communicates with an orifice 1036 which extends to (beyond) an outer surface of the heater stage. When vacuum is applied to the orifice, the mask 1010 is held firmly onto the heater stage 1008. The groove 1030 is preferably at least one inch (2.5 cm) away from (outside of) the area 1032 of cells 1034. It is preferred not to have the vacuum groove too close to the area of the cells so as to avoid the vacuum applied thereto exerting a suction on the molten solder paste (including flux) when the heater stage is heated up (as described hereinbelow). Since the heater stage is functioning as the pressure plate in capturing (closing off) the cells, it is important to maintain intimate contact with a mask having cells which are through holes and the surface of the heater stage, and to substantially prevent the mask from warping. The vacuum groove 1030 achieves this purpose, while allowing for some expansion and/or contraction of the mask 1010 without buckling.

Generally, blind hole masks (e.g., 500) are not preferred, it having been found that to manufacture a blind hole mask is difficult with respect to maintaining uniform hole depth (hence, cell volume), particularly when etching is the preferred hole-making process (in favor of drilling). The vacuum groove 1030 in the heater stage makes a through-hole mask behave like a blind hole mask, in the sense that leakage between the mask and the heater stage (in the role of closing off the cells) is substantially eliminated.

The magnets 1026 "assemble" the heater stage to the mask carrier so that the heater stage can shuttled along with the mask. The vacuum holds the mask to the heater stage, thereby capturing the cells on one side of the mask. These two features have the following benefits:

keeps solder paste from leaking under through-hole type mask holds mask to ensure uniform heating or outer mask area holds mask during extraction, keeps mask from warping In the case of a mask with cells which extend through the mask (as illustrated, and as preferred), any leakage between the mask and the heater stage will adversely affect the subsequent ball formation. A pressure plate may optionally be disposed between the heater stage and the mask, but is not necessary. With a blind hole type mask, the holes would be disposed away from the surface of the heater stage (e.g., the "pressure plate portion" 520 of the blind hole mask 500 would be against the surface of the heater stage), and leakage between the mask and the heater stage would not be an issue, but it is nevertheless important to maintain intimate contact between the heater stage and the mask. The mask is relatively thin (e.g., 0.003 inches=3 mils), and is therefore prone to warping, particularly when heated and constrained by a frame. The heater stage is relatively thick, and (in relative terms) not prone to warping. It is important in any case to maintain intimate surface-to-surface contact between the heater stage and the mask during not only the mask printing step (discussed hereinbelow), but throughout the entire process of forming solder balls, to avoid mask warping. Maintaining mask flatness (i.e., avoiding mask warping) is very important to successful ball formation and yield (e.g., avoidance of voids).

Meanwhile, as shown in FIG. 11A, the wafer 1006 is loaded onto the chuck 1004, which is movable in the vertical axis, and the chuck may be positioned slightly (e.g., 0.005 inches, 5 mils) below "contact height" (see, e.g., the dashed line in FIG. 10). Contact height is the height at which the mask will contact the wafer, when shuttled over to the left, and it is simply a good idea to leave a small clearance between the mask and the wafer so that the mask can be positioned onto the wafer without mechanical interference. This step can be before, during or after the first process step of securing the mask to the heater stage.

About the "clearance", which is comparable to the "gap" described hereinabove. The clearance dimension of 5 mils is about 5 times as great as the average size of a typical 1 mil diameter solder particle filling a mask cell. The typical mask cell has a cross-dimension (diameter, in the case of a cylindrical cell) of approximately 4-10 mils.

Next, the mask is printed—in other words, the cells 1034 of the mask 1010 are filled with solder paste (not shown, see, e.g., FIG. 1B). This can be done in any suitable manner, so long as the cells of the mask are substantially and uniformly filled, and that there is substantially no excess solder paste on the surface of the mask. An exemplary technique for printing the mask is described hereinbelow, with respect to FIG. 12.

It is preferred to print "off-line"—in other words, not on the wafer. If printing on the wafer (as described in the parent application), it must be appreciated that the surface of the wafer is often not very flat, topographically speaking. And this topography can lead to variations in the effective overall volume of a cell being filled with solder paste. As a general proposition, any variations in the process, from cell-to-cell, are simply not desirable. Hence, printing on a known flat surface—i.e., the surface of the heater stage—is preferred. Also, by printing "off-line", the wafer is spared from the sometimes excessive forces required to get a good print (effective cell filling).

The heater stage is, of course, at this point in the process, substantially at "room temperature" (not heated). Else, flux in the solder paste in the cells of the mask would start to vaporize, etc. This represents a departure from many of the processes generally described in the parent application, where it was described to be desirable to have the heater stage preheated, at all times.

Next, as shown in FIG. 11B, the assembly of the printed mask and the heater stage ("mask/stage", as held together by magnets 1026) are shuttled over to the wafer 1006 which is sitting on the chuck 1004.

Then, the lift magnets 1028 are turned on firmly secure ("assemble") the mask carrier to the chuck. This ensures that the chuck and wafer pads will maintain alignment to the mask holes during transfer. Then chuck can then be shuttled to the 135-degree (90+45 degree) position for reflowing the solder paste. (The 135 degree position is shown in FIG. 10C.)

The heater stage lift magnets 1026 and the chuck lift magnets 1028 are phased (poled) oppositely so that they do not cancel out when everything (heater stage—mask—chuck) is assembled together.

Although this step of contacting the wafer to the mask is shown with the wafer in the non-inverted position, it is within the scope of the invention that the wafer and chuck could be shuttled over to the mask/stage, or that both the wafer/chuck and mask/stage could be shuttled to an intermediate position.

Next, the chuck is pressurized—for example to approximately 3 psi. As described hereinabove, this will ensure positive intimate contact of the wafer with the mask. (This will also take up the 0.005" clearance, mentioned above.) This intimate contact is beneficial because:

- it contains the solder paste during heat up;
- keeps the mask from warping; and
- ensures contact of the wafer pads with the balls which will be formed in the mask.

Next, the heater stage is heated up, according to a desired profile (temperature schedule). For example, the heater stage is first heated to approximately 150 degrees (C.), which will activate the flux.

With the flux activated, the assembly of chuck/wafer/mask/stage may be shuttled to t nearly inverted position, such as 135 degrees (FIGS. 10C, 11C; compare FIG. 4D). This is advantageous for wafers having irregular topography, but is not necessary for wafers having relatively flat top surfaces.

Next, the temperature is increased sufficiently to reflow the solder paste and permit balls to form. For conventional 63/37 Pb/Sn eutectic, this is at least about 183 degrees (C.). The preferred temperature for the described process is 195-200 degrees.

As shown in FIG. 10C, when the solder paste reflows, it forms balls 1040 (compare 340) on pads 1044 (compare 304) of the substrate (wafer) 1006 (compare 302). The balls extend (grow) out of the cells 1024 of the mask 1006 and wet themselves to the pads of the wafer. This semi-inverted orientation causes solder paste to be forced (by gravity) into a 90 degree corner (bottom left, as viewed) in each cell of the mask, allowing venting at the opposite corner (top right, as viewed).

Finally, the wafer is extracted after some time (dwell) at maximum (solder reflow) temperature. The pressure (e.g., 3 psi) is turned off at the chuck, and the wafer is slowly pulled away from the mask. This is advantageously done before the re-flowed solder material has solidified, thereby facilitating mask removal. However, caution should be exercised with respect to slowly separating the mask from the wafer (or vice versa) to that air currents and/or suction are not created. For example, a separation speed of about 2 inches per second has been found reasonable.

A chamber is optionally formed between the chuck and the mask holder so that the atmosphere can be controlled, e.g., $NO_2$.

After mask removal, the heater stage can be shuttled back (with the mask holder) to its original position, awaiting the next cycle.

Then, the mask can be moved to a neutral position for removal or cleaning.

Observations

The molten solder ball remains in contact with the mask edges inside the aperture (cell), depending on the amount of interference. For example, a 0.004 ball inside a 0.003 mask will have 0.001 interference. The ball flat will be located at some distance from the aperture wall at any rotational position. That means if the pad were to be skewed to one side of the aperture and the ball on the other side, a "miss" could occur (no copper pad in contact with liquid solder). Therefore, good initial alignment is very important.

Normally, the balls are formed on the wafer with the wafer uninverted—with the pads atop the wafer (rather than below, or "inverted", as discussed in detail in the parent application). The 135 degree partially-inverted scenario (FIG. 10C) appears to only be required with wafers having high topography (deviating from flat). Other angles, such as between 20 or 30 degrees and 60 degrees are believed to be beneficial for partially-inverted. With highly planar (low topography) wafers, however, little difference is observed between reflowing partially-inverted and non-inverted.

During reflow, solder paste (particles of solder in flux) first outgases some flux, then the solder balls begin to shrink into a slug (no interference is observed when solder is a slug). Then a complete melting and complete surface tension equilibrium causes interference and the liquid solder wets to the solid copper pad. This is the reason for having little to no voids in the solder pad interface. In an experimental bumping situation, only 0.4% of the pads had voids, and the voids were less than 5% of pad diameter.

A significant benefit accrues to printing the mask without the wafer being present. Normal print pressure is on the order of 60 psi (pounds per square inch), and this is a lot of pressure to subject a wafer to. By avoiding this, the only pressure exerted on the wafer is the 3 psi used to flex the wafer into intimate contact with the mask prior to reflow.

Printing (Filling the Mask Cells)

FIG. 1 (above) illustrates a technique 100 for forming solder balls on a surface of a substrate 102, such as is set forth in U.S. Pat. No. 5,988,487. The substrate 102 has number of pads 104 on its top (as viewed) surface. The pads 104 are typically arranged in an array, having a pitch (center-to-center spacing from one another). The substrate 102 is disposed atop a heater stage 106. A mask (stencil) 110 is provided. The mask 110 is a thin planar sheet of relatively stiff material, such as molybdenum, having a plurality of openings (cells) 112, each corresponding to a pad 104 whereupon it is desired to form a solder ball on the substrate 102. The mask 110 is placed on the top (as viewed) surface of the substrate 102 with the cells 112 aligned over the pads 104. The cells 112 in the mask 110 are filled with solder material 114. This is done in any suitable manner such as by smearing solder material on the top (as viewed) surface of the mask 110 and squeegeeing the solder material 114 into the cells 112 of the mask 110. Squeegeeing is typically a multi-pass process.

The cells 112 in the mask 110 may be filled with solder paste prior to placing the mask 110 on the top surface of the substrate, in which case the solder-paste-filled cells 112 would be aligned over the pads 104.

A pressure plate 120 is disposed onto the top (as viewed) surface of the mask 110. This holds the mask 110 down onto the substrate 102, and the substrate 102 down onto the heater stage 106. This also closes off the cells 112 ("captured cell"). The heater stage 106 is heated up, typically gradually, to a temperature sufficient to cause the solder material in the cells 112 to melt (reflow). When the solder material melts, the individual solder particles will merge (flow) together and, due to surface tension, will try to form (and, typically, will form) a sphere. When the solder material re-solidifies, it assumes a general spherical or hemispherical shape. The mask 110 is then removed from the substrate 102.

FIG. 1A (above) is an enlarged (magnified) view of the substrate 102 shown in FIG. 1, after completion of ball bumping. Herein it can be observed that the solder balls 130 are generally spherical, have a diameter "D" and have a height "H".

When printing, for example, on the surface of an integrated circuit wafer, it must be appreciated that the surface of the wafer is often not very flat, topologically speaking. And this irregular topology can lead to variations in the effective overall volume of a cell being filled with solder paste. Also, as mentioned above, when printing on an irregular surface, solder paste can ooze out under the mask, creating subsequent problems during reflow. As a general proposition, any variations in the process, from cell-to-cell, are simply not desirable. Hence, printing on a known flat surface (KFS)—such as the surface of the heater stage (e.g., 106)—is preferred. Also, by printing "off-line", the wafer is spared from the sometimes excessive forces required to get a good print (effective cell filling). we didn't mention the excessive force problem above.

According to an aspect of the invention, it is generally preferred to print "off-line"—in other words, with the mask on a smooth surface without irregularities, rather than on the surface of an electronic component (e.g., substrate 102). This is for purposes of (i) uniformity and (ii) to avoid damaging an underlying component.

Off-wafer printing is good for three reasons:
1: Low force
2. Excellent cell volume control
3. Finished solder void control—when the solder paste wets to the pad of a part to be bumped the flux can be trapped during the reflow (solder voids). With off wafer printing the solder paste is not wetted to the pad, the ball is sphere-ized in the mask and only contacts the pad after liquefied this avoids flux trapped voids. No other process offers this void avoidance.

Printing off-line is illustrated, for example, in FIG. 4 of the aforementioned Parent Application which is a schematic diagram of a machine for ball bumping substrates including a print station 414, which may be a flat, non-wettable surface for off-wafer filling of the cells of the mask with solder material.

The flat surface is non-wettable from the solder material's perspective. Suitable materials are Teflon™ coatings and chrome. The flat surface should not only be free from surface topology and defects such as scratches or dings and dents, but will remain flat during heating at high rates. Heat differences coupled with the materials expansion properties may result in warpage during heating.

FIG. 12 illustrates an embodiment of the mask-filling technique of the present invention. It should be understood that the technique is not limited to filling masks for the purpose of ball bumping electronic components, and has more general applicability to any number of printing (mask filling) processes, whether ball bumping or otherwise. It should therefore also be understood that the present invention is not limited to filling masks with any particular solder paste or, for that matter, with solder paste at all. The technique is well-suited to filling the cells of the mask with any material having a viscosity in the range of 20 kcps-300 kcps (kilocentipoise).

As shown in the figure, a quantity (blob, glob, mass) of solder paste 1202 is disposed on the surface of the mask 1210 (compare 110). The mask 1210 is shown as being disposed on a suitable support surface 1208 (compare 106, or 414 of Parent Application). The support surface 1208 may be a wafer, for printing with the mask 1210 already disposed on a wafer (compare 102), if so desired. Or, the support surface 1208 may be any non-wettable surface for off-line filling of the mask.

The mask 1210 has a plurality of cells 1234 (compare 112) which may be arranged in an array. The cells 1234 may be round, square or the like. The mask has a thickness, typically 3 mils. The cells are preferably, but not necessarily, uniform in size, hence volume. For example, a square cell may have a cross-dimension of 6 mils.

A first "print" (or "flood") blade 1220, such as a rubber blade made of 90 Durometer ULON™, is brought to a distance of a few mils (e.g., 5-7 mils) from (above) the surface of the mask 1210. The blade 1220 is advanced in the direction of the arrow 1222. As the blade 1220 advances, the cells 1234 become filled with solder paste 1202 (compare 114). It is preferred that the blade 1220 not contact the mask, and not drag across the mask. Because the blade 1220 is spaced from the mask 1210, there will inevitably be an amount of excess solder paste on the surface of the mask behind (to the left of, as illustrated) the blade 1220.

Since the blade 1220 is not in contact with the mask 1210, the contact pressure is essentially zero. This can be important when the mask 1210 is supported on a delicate electronic component that might be adversely affected by pressure.

The gap (spacing) between the blade 1220 and the surface of the mask 1210 is generally dependent upon the size of particles (not illustrated) in the solder paste 1202. Typically, the gap is 2-5 times the average particle size.

The blade 1220 suitably has a thickness of approximately 0.250 inches, is spaced approximately 5-7 mils from the surface of the mask 210, and is suitably formed of a material ranging from a very hard material such as stainless steel to a relatively soft material such as 60 Shore A rubber. A suitable material is Ulon™.

Since the principal purpose of the flood blade 1220 is simply to push solder paste into the cells, its composition and end-profile (e.g., dull versus pointy) do not matter very much.

Preferably, the flood blade 1220 is inclined in the direction of travel, rather than straight up and down (as illustrated)—for example at an angle of 75 degrees (rather than 90 degrees, as illustrated) with respect to the surface of the mask.

A second, "cleaning" blade 1230, such as a Permalex™ blade by Transition Automation SPK-PLX-1.5-9, is disposed so as to contact the mask 1210, and advances in the direction of the arrow 1222. In essence, the cleaning blade 1230 follows a suitable distance behind the flood blade 1220, and performs "clean up" duty. By way of example, the distance between the two blades 1220 and 1230 is approximately 1" (one inch) which is quite suitable for printing a mask for a 6 or 8 inch wafer. This distance between the blades 1220 and 1230 should be sufficient to allow room for the accumulation of paste left behind by the flood blade 1220.

Since the cleaning blade 1230 need not perform a cell-filling function, it can have a low contact force (e.g., 2500 grams) with the surface of the mask 1210. As discussed above, a high contact force can be undesirable. And the non-compliance of the blade 1230 allows it to clean the surface of the mask without gouging (removing solder paste from) the already-filled cells.

The blade 1230 is suitably spring steel or the like, then the tip or printing edge is coated with a polyimide coating, then a final metal coating is deposited. This as claimed by the manufacturer is the common ground between hard steel (no compliance requiring high pressures to obtain complete contact) and soft rubber that deflects into cell volume and gouges (conforms too well)

The blade 1230 suitably has a thickness of 0.010 inches, is in contact with the surface of the mask 1210, and is suitably formed of a material ranging from a very hard material such as stainless steel to a relatively hard material such as spring steel. The end of the blade 1230 in contact with the mask 1210 and is specially coated to ensuring good cleaning of the mask surface without gouging solder paste out of the cells.

The flood blade 1220 and the cleaning blade 1230 may move in unison, or independently from one another. The may both be inclined in the direction of travel. The flood blade 1220 is suitably of a plastic material, and is spaced a distance equivalent to a few (e.g., 2-5) average solder paste particle sizes from the surface of the mask 1210. The cleaning blade 1230 is suitably of a metal material, and is preferably thicker than the cross-dimension of a cell 1234. The flood blade 1220 and the cleaning blade 1230 are shown out-of-scale (not to scale), vis-a-vis the mask 1210, for illustrative clarity.

Therefore, the invention can generally be characterized as comprising using two dissimilar blades to fill cells of a mask (1210) with solder paste (1202). The first blade (1220) is not in contact with the mask, and therefore "overfills" the cells. The second blade (1230) follows behind (after, later) the first blade (1220) and removes excess solder paste from the surface of the mask. The first blade (1220) exerts no direct pressure on the mask. The second blade (1230) exerts very little pressure on the surface of the mask. The first blade (1220) is of a wide range of materials. The second blade (1230) is preferably of a non-compliant material.

A person having ordinary skill in the art to which this invention most nearly pertains will recognize that any suitable mechanical mechanism (e.g., actuators, etc.) can be used to control the movement of the blades (1220, 1230) across the surface of the mask (1210), and that they can be moved in unison with one another, or independently from one another.

The two blades (1220, 1230), herein considered to be a "set" of blades, can be moved in unison, as discussed above, with the second blade (1230) trailing the first (1230) and moving in the same direction as the first (1220). The technique of the present invention has been found to be reliable for fully filling the cells of a mask, in only one pass. Alternatively, the second blade (1230) can be independently moved across the surface of the mask, including in a different direction than the first blade (1220), including making more than one pass across the mask to ensure that the surface of mask is clean.

FIG. 13 illustrates an embodiment of a set of blades comprising a first blade 1320 (compare 1220) and second blade 1330 (compare 230) for printing a mask 1310 (compare 210). Profiles for the two blades 1320 and 1330 are described. The flood blade 1320 is generally rectangular in cross-section, having a leading edge (surface) 1322, a trailing edge (surface) 1324 which is generally parallel to the leading edge, and a side edge (surface) 1326 (comprising 1326a,b,c) which is generally perpendicular to the leading and trailing edges. In use, the side edge 1326 is disposed opposing (facing) the mask 1310, but is not in contact with the surface of the mask. (A non-wettable support surface, compare 1208, is omitted, for illustrative clarity.)

The side edge 1326 is chamfered (beveled) so as to present a sloping surface for pushing the solder paste (1202) down into the cells of the mask when the blade 1320 is moved (left-to-right in the illustration) across the mask 1310. For example, from the trailing edge 1324, the side edge 1326 has a first area 1326a which is flat and perpendicular to the trailing edge 1324 (and parallel to the mask 1310), followed by a second area 1326b which forms approximately a 45-degree angle with the first area 1326a, followed by a third area 1326c which forms a steeper, approximately 60-degree angle with the first area (or, a shallow, approximately 30-degree angle with respect to the leading edge 1322). This "business end" of this blade 1320 is shown with a flat area 1326a and compound bevel 1326b,c at the junction of the side edge 1326 and the leading edge 1322. The flat area 1326a is preferably approximately 75% of the overall blade thickness.

When the blade 320 is moved across a mask, with a glob of solder paste in from of it (see, e.g., FIG. 2), the 60-degree area 1326c is the first to encounter the older paste (see FIG. 2) as the blade moves across the mask. This angle, being less than 90-degrees, starts to push the solder paste down as the blade 1330 moves, exerting a mild downward force on the solder paste. (It should be understood that a similar result could be obtained by tilting the entire blade 230 of FIG. 2 forward 30-degrees from vertical.) The next, 45-degree area 1326b further helps to push the solder paste down into the cell. (With a 30-degree tilted blade, this area would be 15-degrees steeper.) Finally, the flat area 1326a forces the solder paste into the cell.

In any case, the flood blade 1320 has at least one area which first encounters the solder paste at an angle between flat (parallel to the mask surface) and vertical (perpendicular to the mask surface), to start pushing (directing) the solder paste down into the cells, followed by a substantially flat (parallel to the mask surface) area for finally pushing (forcing) the solder paste into the cells. The point is to fill (in this case, overfill) the cells of the mask in one pass, without requiring exerting a lot of pressure on the mask (particularly if the mask were atop a delicate electronic component).

FIG. 13 also illustrates an embodiment of a cleaning blade 1330 (compare 1230). As mentioned above, the cleaning blade 1330 is preferably formed of a relatively non-compliant material, such as metal. The cleaning blade 1330 comes into contact with the mask 1310. An end portion 1332 of the cleaning blade 1320 preferably forms an approximately 45-degree angle with the surface of the mask 1310. For example, between 30-degrees and 60-degrees, preferably approximately 45-degrees. The cleaning blade 1330 could simply be one flat sheet of metal inclined at said approximately 45-degrees. However, in a set of blades moving in unison across a mask, the cleaning blade 1330 needs to "fit" behind the flood blade 1320. Therefore, the cleaning blade 1330 is suitably bent (folded) so that the angled end portion 1332 extends from a base portion 1334 which extends substantially parallel to the flood blade 1320 (perpendicular to the mask 1310). (Here, the end portion 1332 is shown at 45 degrees to the surface of the mask. The end portion 1332 should be between 30-60 degrees to the surface of the mask. The end portion 1332 forms an obtuse angle with the base portion 1324.) It has been found that the base portion 1334 should be at least 2" (two inches, 5 centimeters) in length for filling a "normal" mask for ball bumping a 6-8 inch wafer. This dimension was determined empirically. The "long" (quasi-cantilevered, compliantly-mounted) mounting of the cleaning blade performs well. It is believed that it creates a bit of compliance, avoiding "chatter" during the process of scraping excess solder paste off of the surface of the mask.

FIG. 14 illustrates an arrangement wherein two sets of blades are used to expedite automatic mask printing. The drawing is merely illustrative, and is not to scale. A first set of blades comprises a flood blade 1420 (compare 1320) and a cleaning blade 1430 (compare 1330). A second set of blades comprises a flood blade 1440 (compare 1320) and a cleaning blade 1450 (compare 1330). A mask 410 (compare 1310) is disposed between two print landing areas 1450 and 1460. (A non-wettable support surface, compare 1208, is omitted, for illustrative clarity.)

The first set of blades 1420/1430 is "parked" on the first print landing area 1460. A glob of solder paste (compare 1202) is disposed in front of the flood blade 1420, on the first print landing area 1460. The first set of blades 1420/1430 then advances across the mask 1410 (from left-to-right, as illustrated), towards the second print landing area 1470, to fill the cells of the mask (to "print" the mask). The first set of blades continues to print, until it is entirely beyond the mask, and until the residual solder paste (that portion of the solder paste which did not make it into the cells) that is being pushed forward is on the second print landing area 1470. Then the first set of blades 420/430 can be retracted, and repositioned on the first print landing area 1460. Meanwhile, the printed mask is taken away, and another, subsequent mask is positioned between the two print landing areas 1460 and 1470 to be printed. The second set of blades 1440/1450 is the "mirror image" of the first set of blades, and prints the subsequent mask by pushing the residual solder paste across the mask, from right-to-left (as illustrated). When finished, the residual solder paste that has been pushed forward (to the left) by the second set of blades will be on the first print landing area 1460, and the second set of blades will return to its starting position. A subsequent mask can then be printed by the first set of blades pushing this residual solder paste over the subsequent mask onto the second print landing area, etc, so long as there is an adequate supply of residual solder paste. In this manner, certain efficiencies of operation can be achieved.

CONCLUSION

In conclusion, the inventors offer the following general observations for successfully forming solder bumps (including balls and reflowable interconnect structures) on substrates, particularly semiconductor wafers.

Closing (capturing) the cells is important because as the solder heats to reflow temperatures some of the flux component outgases to vapor, this vapor will expel solder material before the reflow temperature is achieved and poor volume control will result. The captured cell is also used to control or limit mask warpage during heating. This mask warpage is contained to ensure the proximity of the solder to the pad to be soldered.

Inverting, or partially inverting has been found to be often of limited importance for small solder balls, because surface tension forces tend to dominate the cell bump behavior. However, inverting or partially inverting can be very important for bumping large solder balls since it facilitates venting the large volumes of gas produced by the greater amount of solder paste present.

Using electromagnets (1028) to secure the mask carrier (1020) to the chuck base (1014) can be very beneficial since the power which is applied to the electromagnets can be controlled. For example, during alignment of the mask to the wafer, the electromagnets can be turned on slightly to produce a bit of drag as the mask and wafer are aligned with one another.

The double blade printing process (e.g., FIG. 12) is important because when printing low viscosity material into small mask openings the material will tend to wet the top surface of the mask opening and not allow the cell to fill properly. As it is desirable to use low viscosity solder pastes to control particle suspension uniformity, and provide sufficient flux for soldering, this double blade printing process has proven to be a very effective method of reliably filling small mask openings over a wide range of solder paste materials.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. Apparatus for forming solder balls on substrates comprising:
   a chuck assembly, said chuck assembly comprising:
      a rigid, generally planar chuck base having a cavity extending into the chuck base from a top surface thereof; and
      a generally planar, flexible diaphragm extending across the cavity and secured to the chuck base;
      said cavity being sized and shaped to receive the diaphragm;
   a solder ball mask above the top surface; and
   wherein positive pressure introduced into the cavity causes the diaphragm to deflect toward the mask in a manner where a substrate disposed between the diaphragm and the solder ball mask is urged against the mask.

2. Apparatus, according to claim 1, further comprising:
   an inlet tube extending from exterior the chuck base to within the cavity, underneath the diaphragm.

3. Apparatus, according to claim 1, further comprising:
   a permeable substrate disposed beneath the diaphragm, between the diaphragm and a bottom surface of the cavity.

4. Apparatus, according to claim 3, wherein:
   the permeable substrate comprises a powdered metal plate.

5. Apparatus, according to claim 1, wherein:
   the diaphragm comprises a sheet of silicon rubber material.

6. Apparatus, according to claim 1, further comprising:
   a generally planar, flexible manifold element; and
   a recess, coaxial with and larger than the cavity, extending into the chuck base from the top surface thereof, said recess being sized and shaped to receive the manifold element.

7. Apparatus, according to claim 6, wherein the manifold element has a top surface and a bottom surface and comprises:
   a plurality of grooves extending across the top surface of the manifold element;
   an opening extending from the top surface of the manifold element through to the bottom surface of the manifold element, and
   the opening is aligned with an inlet orifice in the chuck base.

8. Apparatus, according to claim 7, wherein:
   the plurality of grooves comprise two parallel sets of intersecting grooves.

9. Apparatus, according to claim 6, wherein:
   the manifold element extends across the recess, and is secured to a top surface of the diaphragm.

10. Apparatus, according to claim 6, wherein:
   the manifold element comprises a sheet of a film material.

11. A chuck assembly for holding a semiconductor wafer in intimate contact with a mask, comprising
   a rigid, generally planar chuck base, characterized by:
      a central recess extending into the stage from a top surface thereof, said recess sized and shaped to receive a generally planar, flexible diaphragm, said diaphragm extending across the recess;
   a solder ball mask above the top surface; and
   wherein positive pressure introduced into the cavity causes the diaphragm to deflect toward the mask in a manner where a semiconductor wafer disposed between the diaphragm and the solder ball mask is urged against the mask.

* * * * *